US009650237B2

(12) United States Patent
Ocak et al.

(10) Patent No.: US 9,650,237 B2
(45) Date of Patent: May 16, 2017

(54) ELECTROMECHANICAL DEVICE INCLUDING A SUSPENDED STRUCTURE AND METHOD OF FABRICATING THE SAME

(71) Applicant: Agency for Science, Technology and Research, Singapore (SG)

(72) Inventors: Ilker E. Ocak, Singapore (SG); Julius Ming Lin Tsai, Singapore (SG); Navab Singh, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/778,514

(22) PCT Filed: Apr. 17, 2014

(86) PCT No.: PCT/SG2014/000170
§ 371 (c)(1),
(2) Date: Sep. 18, 2015

(87) PCT Pub. No.: WO2014/171896
PCT Pub. Date: Oct. 23, 2014

(65) Prior Publication Data
US 2016/0289063 A1    Oct. 6, 2016

(30) Foreign Application Priority Data
Apr. 19, 2013    (SG) .................................. 201302993

(51) Int. Cl.
*B81B 7/00*    (2006.01)
*H01L 25/00*   (2006.01)
(Continued)

(52) U.S. Cl.
CPC ........ *B81B 7/0048* (2013.01); *B81C 1/00285* (2013.01); *G01C 19/56* (2013.01);
(Continued)

(58) Field of Classification Search
CPC ............ H01L 2924/1461; H01L 23/10; H01L 2224/0401; H01L 24/05; H01L 24/29;
(Continued)

(56) References Cited

U.S. PATENT DOCUMENTS 7,318,349 B2    1/2008    Vaganov et al.
7,784,344 B2    8/2010    Pavelescu et al.
(Continued)

OTHER PUBLICATIONS

Written Opinion for International Application No. PCT/SG2014/000170 dated Jun. 19, 2014, pp. 1-4.
(Continued)

*Primary Examiner* — Duy T Nguyen
(74) *Attorney, Agent, or Firm* — Winstead, P.C.

(57) ABSTRACT

An electromechanical device and method of fabrication thereof comprising: providing a first wafer with a circuit arrangement on a first surface thereof and a first electrode on a second surface thereof; forming first and second via structures from the first surface to the second surface of the first wafer, said first via electrically connecting the first electrode with the circuit arrangement; providing a second wafer with a suspended structure on a first surface thereof; forming a second electrode on the suspended structure; forming an interconnect structure on the first surface of the second wafer that electrically connects with the second electrode; bonding the first wafer to the second wafer with the second surface of the first wafer facing the first surface of the second wafer, with the second via structure electrically connecting the circuit arrangement to the interconnect structure, and the first and second electrodes forming a capacitive structure.

20 Claims, 32 Drawing Sheets

(51) Int. Cl.
  *G01C 19/56*   (2012.01)
  *G01R 33/00*   (2006.01)
  *G01R 33/028*  (2006.01)
  *G01P 15/08*   (2006.01)
  *G01P 15/125*  (2006.01)
  *B81C 1/00*    (2006.01)

(52) U.S. Cl.
  CPC ........ *G01P 15/0802* (2013.01); *G01P 15/125* (2013.01); *G01R 33/00* (2013.01); *G01R 33/0052* (2013.01); *G01R 33/0286* (2013.01); *H01L 25/00* (2013.01); *B81B 2201/0235* (2013.01); *B81B 2201/0242* (2013.01); *B81B 2201/0271* (2013.01); *B81B 2201/0292* (2013.01); *B81B 2203/04* (2013.01); *B81B 2207/07* (2013.01); *B81C 2203/0118* (2013.01); *B81C 2203/0172* (2013.01); *G01P 2015/0814* (2013.01); *G01P 2015/0828* (2013.01); *H01L 2924/0002* (2013.01)

(58) Field of Classification Search
  CPC .............. H01L 24/32; H01L 41/1138; H01L 2224/29011; H01L 24/92; H01L 2924/0002; H01L 2924/00; H01L 25/00; B81B 2207/09; B81B 2203/0315; B81B 2207/096; B81B 2207/097; B81B 2201/0235; B81B 2201/0242; B81B 2201/0271; B81B 2201/0292; B81B 2203/04; B81B 2207/07; B81B 7/0048
  See application file for complete search history.

(56) References Cited

U.S. PATENT DOCUMENTS

| | | | |
|---|---|---|---|
| 8,146,425 | B2 | 4/2012 | Zhang et al. |
| 8,250,921 | B2 | 8/2012 | Nasiri et al. |
| 8,350,346 | B1 | 1/2013 | Huang et al. |
| 2004/0150939 | A1 | 8/2004 | Huff |
| 2007/0099395 | A1 | 5/2007 | Sridhar et al. |
| 2008/0122560 | A1 | 5/2008 | Liu |
| 2010/0295138 | A1 | 11/2010 | Montanya Silvestre et al. |
| 2011/0121412 | A1 | 5/2011 | Quevy et al. |
| 2012/0326248 | A1 | 12/2012 | Daneman et al. |
| 2013/0001710 | A1 | 1/2013 | Daneman et al. |
| 2013/0019680 | A1 | 1/2013 | Kittilsland et al. |
| 2013/0043547 | A1* | 2/2013 | Chu ........................ H01L 24/81 257/415 |
| 2013/0168740 | A1* | 7/2013 | Chen .................. B81C 1/00238 257/254 |

OTHER PUBLICATIONS

International Preliminary Report on Patentability for International Application No. PCT/SG2014/000170 dated Oct. 20, 2015, pp. 1-6.

* cited by examiner

FIG. 3B

| Sensor | Measure. Axis / Movement | 3 Metal Layer | TSV | Getter | Top Electrode | Vacuum |
|---|---|---|---|---|---|---|
| Vertical Axis Magnetometer | Lateral | ✓ | ✓ | ✓ | | ✓ |
| Lateral Axis Magnetometer | Lateral / See-Saw | ✓ | ✓ | ✓ | | ✓ |
| Differential Vertical Axis Accel. | Vertical / See-Saw | | ✓ | ☞ | ✓ | ☞ |
| Single Ended Vertical Axis Accel. | Vertical | | ✓ | ☞ | ✓ | ☞ |
| Lateral Axis Accel. | Lateral | | ✓ | ☞ | | ☞ |
| Fully Differential Lateral Axis Accel. | Lateral | ✓ | ✓ | ✓ | | ✓ |
| Vertical Axis Gyroscope | Lateral | | ✓ | ✓ | | ✓ |
| Lateral Resonator | Lateral | | ✓ | ☞ | | ☞ |
| See-Saw Resonator | See-Saw | | ✓ | ☞ | ✓ | ☞ |

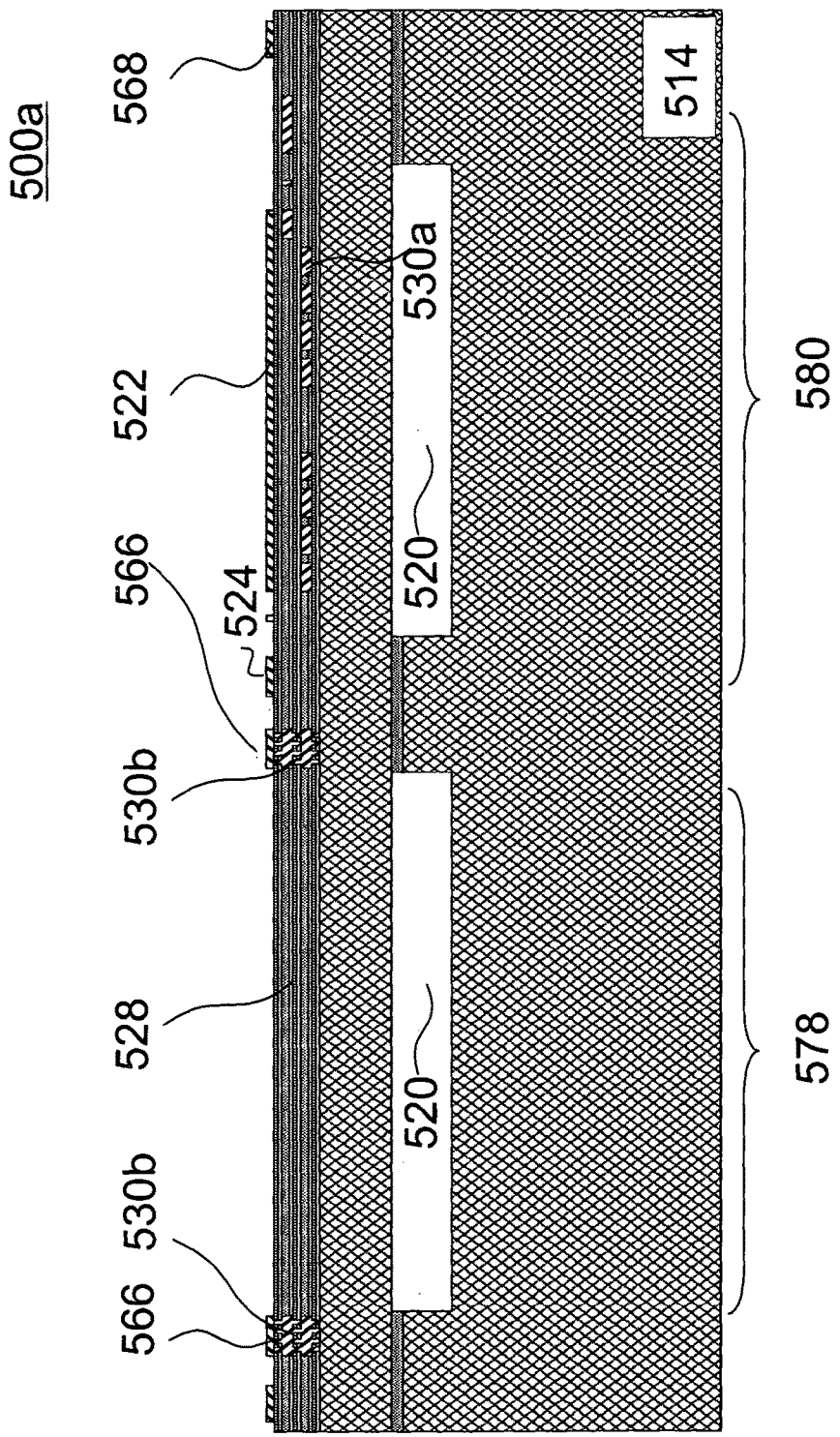

ELECTROMECHANICAL DEVICE INCLUDING A SUSPENDED STRUCTURE AND METHOD OF FABRICATING THE SAME

CROSS-REFERENCE TO RELATED APPLICATIONS

This application is a 35 U.S.C. §371 application of International Application No. PCT/SG2014/000170 filed on Apr. 17, 2014 which claims the benefit of priority of SG application No. 201302993-9 filed Apr. 19, 2013, the contents of it being hereby incorporated by reference in its entirety for all purposes.

TECHNICAL FIELD

Various aspects of this disclosure relate to electromechanical devices and methods of fabricating the same.

BACKGROUND

Inertial navigation sensors play a very important role in today's technology. Gyroscopes and accelerometers are widely used for tracking the movement and/or velocity of any object, vehicle or person. With more and more applications requiring inertial navigation sensors, there is increasing demand for navigation sensors. Further, the competition in this area is also becoming increasingly harsh with more applications requiring inertial sensors with better performance and at a cheaper cost.

SUMMARY

A method of fabricating an electromechanical device may be provided according to various embodiments. The method may include providing a first wafer. The method may also include forming a circuit arrangement on a first surface of the first wafer. The method may further include forming a first electrode on a second surface of the first wafer. The method may additionally include forming a first via structure from the first surface of the first wafer to the second surface of the first wafer. The first via structure may electrically connect the first electrode with the circuit arrangement. The method may also include forming a second via structure from the first surface of the first wafer to the second surface of the first wafer. The second via structure may electrically connect the circuit arrangement. The method may further include, providing a second wafer. The method may additionally include forming a suspended structure on a first surface of the second wafer with a spacing formed between the suspended structure and a second surface of the second wafer. The method may also include forming a second electrode on the suspended structure. The method may further include forming an interconnect structure on the first surface of the second wafer. The interconnect structure may electrically connect the second electrode. The method may additionally include bonding the first wafer to the second wafer with the second surface of the first wafer facing the first surface of the second wafer. The second via structure may electrically connect the interconnect structure. The first electrode and the second electrode may form a capacitive structure.

An electromechanical device may be provided according to various embodiments. The electromechanical device may include a first wafer having a first surface and a second surface opposite the first surface. The electromechanical device may also include a circuit arrangement on the first surface of the first wafer. The electromechanical device may additionally include a first electrode on the second surface of the first wafer. The electromechanical device may further include a first via structure extending from the first surface of the first wafer to the second surface of the first wafer. The first via structure may electrically connect the first electrode with the circuit arrangement. The electromechanical device may also include a second via structure extending from the first surface of the first wafer to the second surface of the first wafer. The second via structure may electrically connect with the circuit arrangement. The electromechanical device may also include a second wafer bonded to the first wafer. The second wafer may have a first surface and a second surface opposite the first surface. The electromechanical device may additionally include a suspended structure on the first surface of the second wafer with a spacing between the suspended structure and the second surface of the second wafer. The electromechanical device may further include a second electrode on the suspended structure. The electromechanical device may also include an interconnect structure on the first surface of the second wafer. The interconnect structure may electrically connect the second electrode. The first wafer may be bonded to the second wafer with the second surface of the first wafer facing the first surface of the second wafer. The second via structure may electrically connect the interconnect structure. The first electrode and the second electrode may form a capacitive structure.

BRIEF DESCRIPTION OF THE DRAWINGS

The invention will be better understood with reference to the detailed description when considered in conjunction with the non-limiting examples and the accompanying drawings, in which:

FIG. 3B is a table illustrating the electromechanical structures that include various features according to various embodiments.

FIG. 5A is a schematic showing a method of forming a coil structure and a multilayer metal structure on a second wafer according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

It should be understood that the terms "bottom", "top", "left", "right", "on", "corner" etc., when used in the following description are used for convenience and to aid understanding of relative positions or directions, and not intended to limit the orientation of any device or structures or any part of any device or structure.

In various embodiments, a first structure on a second structure may include the first structure directly or indirectly on the second structure. In other words, the first structure and the second structure may be separated by intervening structures such as dielectric layers. In various embodiments, a first structure or cavity on a second structure may include the first structure at least partially embedded in the second structure. A portion of the first structure or cavity may extend to a surface of the first structure.

In various embodiments, a "circuit" may be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

Figure 1:
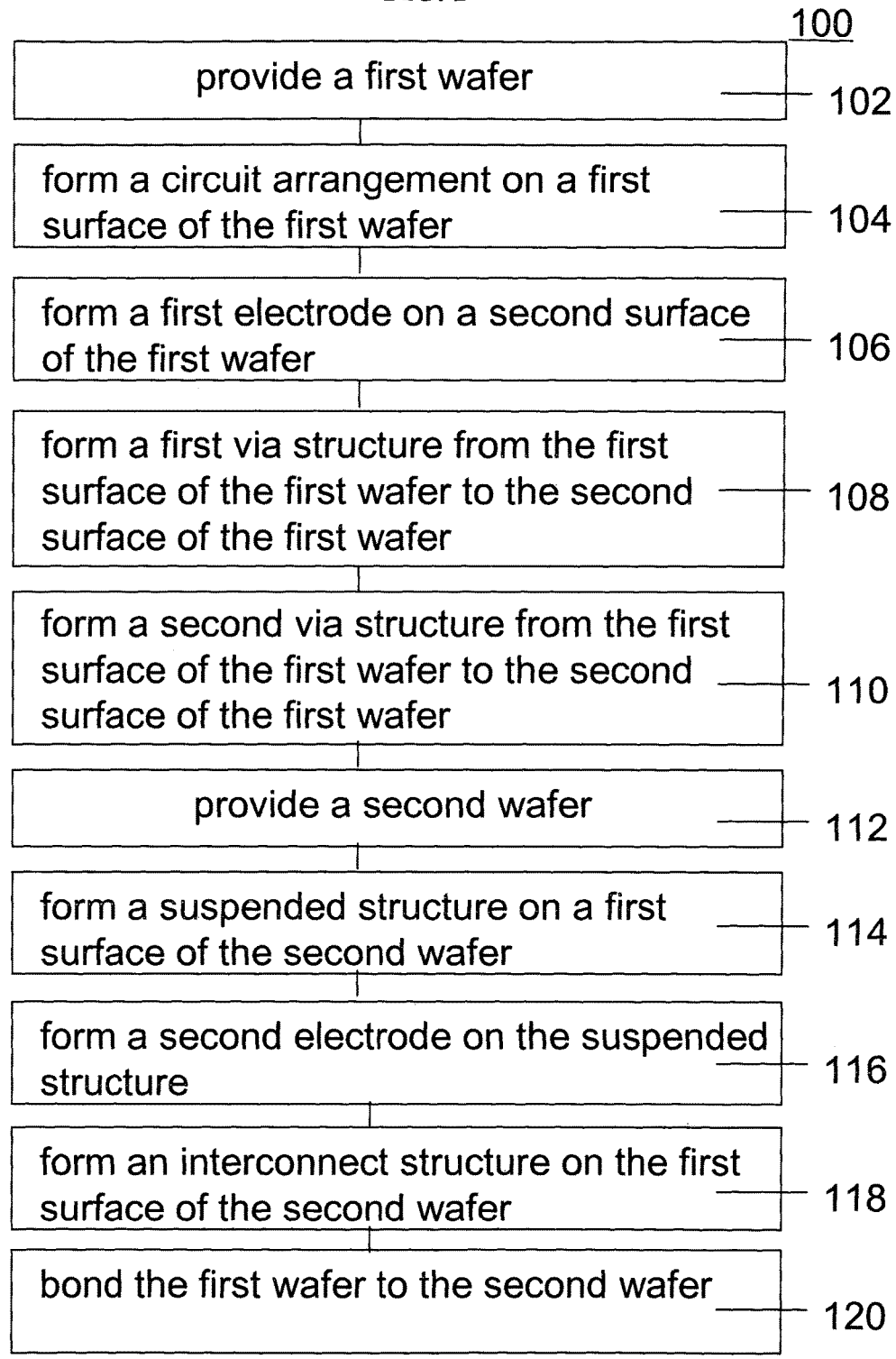
FIG. 1 is a schematic illustrating a method of fabricating an electromechanical device according to various embodiments.

FIG. 1 is a schematic 100 illustrating a method of fabricating an electromechanical device according to various embodiments. The method may include, in 102, providing a first wafer. The method may also include, in 104, forming a circuit arrangement on a first surface of the first wafer. The method may further include, in 106, forming a first electrode on a second surface of the first wafer. The method may additionally include, in 108, forming a first via structure from the first surface of the first wafer to the second surface of the first wafer. The first via structure may electrically connect the first electrode with the circuit arrangement. The method may also include, in 110, forming a second via structure from the first surface of the first wafer to the second surface of the first wafer. The second via structure may electrically connect the circuit arrangement. The method may further include, in 112, providing a second wafer. The method may additionally include, in 114, forming a suspended structure on a first surface of the second wafer with a spacing formed between the suspended structure and a second surface of the second wafer. The method may also include, in 116, forming a second electrode on the suspended structure. The method may further include, in 118, forming an interconnect structure on the first surface of the second wafer. The interconnect structure may electrically connect the second electrode. The method may additionally include, in 120, bonding the first wafer to the second wafer with the second surface of the first wafer facing the first surface of the second wafer. The second via structure may electrically connect the interconnect structure. The first electrode and the second electrode may form a capacitive structure.

In other words, a method of fabricating an electromechanical device, such as a microelectromechanical device, or a nanoelectromechnical device, may be provided. The method may include forming a circuit on a first surface of a first wafer and forming a first electrode on a second surface of the wafer opposite the first surface. A first through via structure may be formed electrically connecting the circuit with the first electrode. A second through via structure may also be formed. The second through via structure may be electrically connected with the circuit. A suspended structure may be formed on a first surface of a second wafer. There may be a gap between the suspended structure and a second surface of the second wafer. The method may also include forming a second electrode on the suspended structure. In addition, the method may include forming an interconnect structure electrically connecting the second electrode. The method may further include bonding the first and the second wafer. The second surface of the first wafer may face the first surface of the second wafer. The second through via structure via may be electrically connected to the interconnect structure and the first electrode and the second electrode may form a capacitor.

The first wafer may be called a complementary metal oxide semiconductor (CMOS) wafer. The second wafer may be called a microelectromechanical structure (MEMS) wafer.

Various embodiments may take up less space compared to other solutions in which the first electrode (i.e. the top electrode) is formed on a third separate wafer, or in which the first electrode (i.e. the top electrode) are formed on the second wafer (e.g. the MEMS wafer) together with the second electrode (i.e. the bottom electrode). Various embodiments may take up less area on the first surface of the first wafer compared to solutions in which the first electrode (i.e. the top electrode) is formed on the first surface of the first wafer (e.g, the CMOS wafer) together with the circuit arrangement, and the area saved may be used for placement of the circuit arrangements (i.e. electrical circuit). Various embodiments remove the necessity of bonding more than 2 wafers for the vertical axis sensors.

In various embodiments, the method may further include forming a sealing structure between the first wafer and the second wafer.

In various embodiments, the method may include forming a coil structure on the first surface of the second wafer. The coil structure may be formed on the suspended structure.

In various embodiments, forming the coil structure may include forming a first metal layer; forming a conductive via on the first metal layer and forming a second metal layer on the conductive via. The coil structure may further include a further conductive via on the second metal layer and a third metal layer on the further conductive via. The metal layers may be ring-shaped or c-shaped.

In various embodiments, the method may also include forming a third via structure from the first surface of the first wafer to the second surface of the first wafer. The method may also include forming a multilayer metal structure on the first surface of the second wafer. The method may further include bonding the first wafer to the second wafer with the third via structure electrically connecting the multilayer metal structure.

The method may also include attaching the first wafer to a transfer wafer with the first surface of the first wafer facing the transfer wafer. The method may additionally include removing a portion of the first wafer to form the second surface of the first wafer.

In various embodiments, the suspended structure, the first electrode on the second surface of the first wafer and the second electrode on the suspended structure may form any one of a lateral axis magnetometer, a differential vertical axis accelerometer, a single ended vertical axis accelerometer and a see-saw resonator.

In various embodiments, the method may further include forming a cavity on the second surface of the first wafer. The method may also include depositing getter material within the cavity.

The method may also include bonding the first wafer to the second wafer to vacuum-seal the cavity.

The method may also include forming a further suspended structure on the first surface of the second wafer with a further spacing formed between the further suspended structure and the second surface of the second wafer. The further suspended structure may be within the vacuum-sealed cavity.

Figure 2:
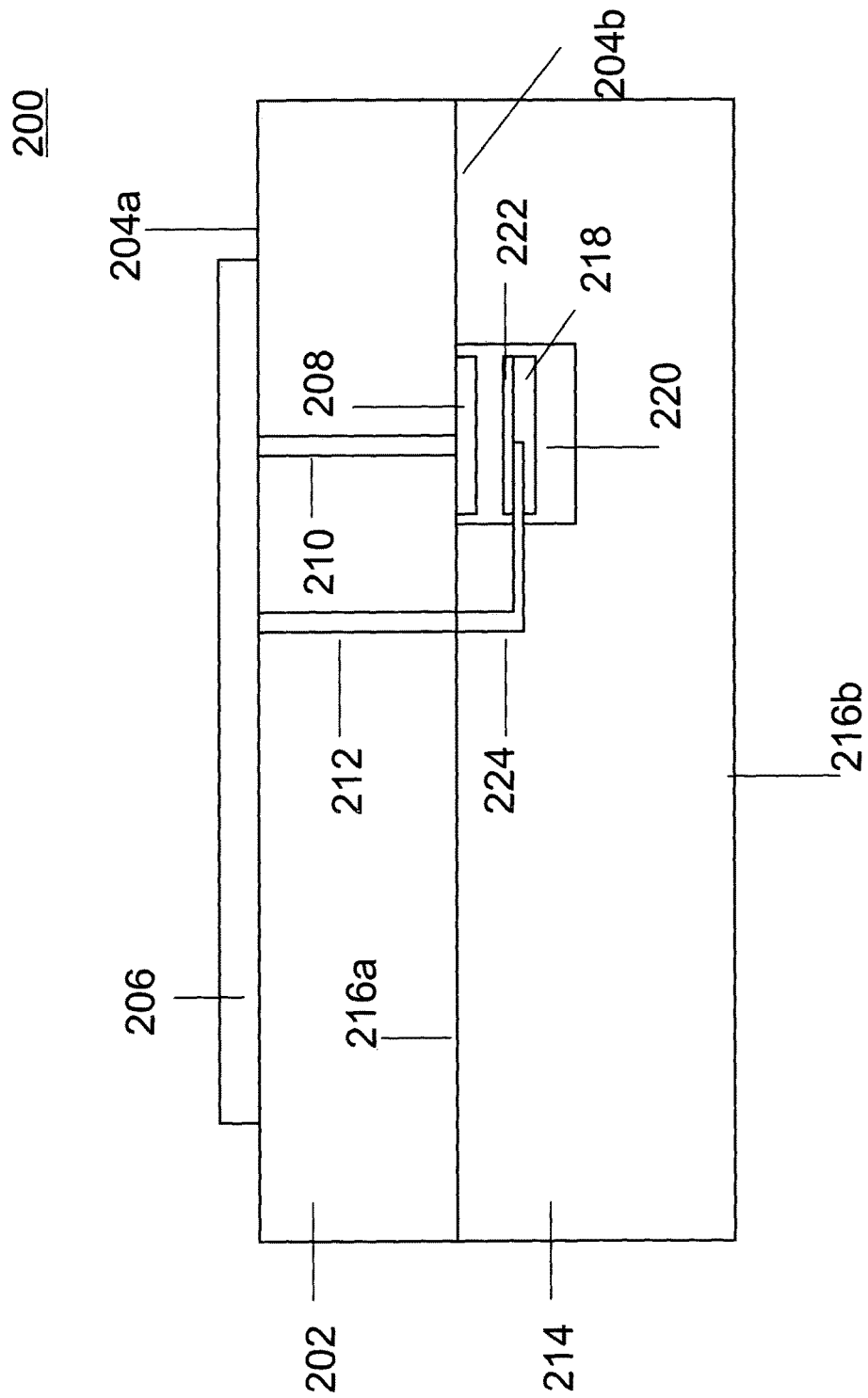
FIG. 2 is a schematic illustrating an electromechanical device according to various embodiments.

FIG. 2 is a schematic 200 illustrating an electromechanical device according to various embodiments. The electromechanical device may include a first wafer 202 having a first surface 204a and a second surface 204b opposite the first surface 204a. The electromechanical device may also include a circuit arrangement 206 on the first surface 204a of the first wafer 202. The electromechanical device may additionally include a first electrode 208 on the second surface 204b of the first wafer 202. The electromechanical device may further include a first via structure 210 extending from the first surface 204a of the first wafer 202 to the second surface 204b of the first wafer 202. The first via structure 210 may electrically connect the first electrode 208 with the circuit arrangement 206. The electromechanical device may also include a second via structure 212 extending from the first surface 204a of the first wafer 202 to the second surface 204b of the first wafer 202. The second via structure 212 may electrically connect with the circuit arrangement 206. The electromechanical device may also include a second wafer 214 bonded to the first wafer 202. The second wafer 214 may have a first surface 216a and a second surface 216b opposite the first surface 216a. The electromechanical device may additionally include a suspended structure 218 on the first surface 216a of the second wafer 214 with a spacing 220 between the suspended structure 218 and the second surface 216b of the second wafer 214. The electromechanical device may further include a second electrode 222 on the suspended structure 218. The electromechanical device may also include an interconnect structure 224 on the first surface 216a of the second wafer 214. The interconnect structure 224 may electrically connect the second electrode 222. The first wafer 202 may be bonded to the second wafer 214 with the second surface 204b of the first wafer 202 facing the first surface 216a of the second wafer 214. The second via structure 212 may electrically connect the interconnect structure 224. The first electrode 208 and the second electrode 222 may form a capacitive structure.

In other words, the electromechanical device may include a first wafer 202 and a second wafer 214. The first wafer 202 may be bonded to the second wafer 214 such that a second surface 204b of the first wafer 202 faces a first surface 216a of the second wafer 214. The first wafer 202 may also have a first surface 204a opposite the second surface 204b. The electromechanical device may have a circuit arrangement 206 on the first surface 204a and a first electrode 208 on the second surface 204b. A first through via 210 may electrically connect the circuit arrangement 206 with the first electrode 208.

In various embodiments, the suspended structure 218 on the first surface 216a of the second wafer 214 may also refer to the suspended structure 218 within a cavity on the first surface 216a of the second wafer 214. The suspended structure 218 may be a movable structure. In other words, the suspended structure 218 may be movable during operation. The gap between the first electrode 208 and the second electrode 222 may be varied, giving rise to a change in capacitance.

The first wafer 202 may be called a complementary metal oxide semiconductor (CMOS) wafer. The second wafer 214 may be called microelectromechanical structure (MEMS) wafer.

Various embodiments may further include a sealing structure between the first wafer 202 and the second wafer 214.

Various embodiments may further include a coil structure on the first surface 216a of the second wafer 214. The coil structure may include concentric rings of metal. The coil structure may include a single layer of metal or may include multiple layers. The metal layers may be separated by one or more dielectric layers. The coil structure may include a first metal layer; a conductive via on the first metal layer and a second metal layer on the conductive via. The coil structure may further include a further conductive via on the second metal layer and a third metal layer on the further conductive via. The metal layers may be ring-shaped or c-shaped. The coil structure may be on the suspended structure 218. The coil structure may also be formed on other portions of the first surface 216a. In various embodiments, the coil structure may be configured to generate a magnetic field. In various embodiments, a method of arranging a magnetic field generating coil on a suspended structure may be provided. The coil structure may be configured to generate the magnetic field on passing a current through the coil structure. The magnetic field generated by the coil structure may interact with an external magnetic field. The interaction of the magnetic field and the external magnetic field may generate a Lorentz force. The Lorentz force generated may cause the suspended structure to move (e.g. oscillate). The movement of the suspended structure may be detected by a change in a capacitance value in the capacitive structure. The coil structure may be necessary for the detection of the external magnetic field and the external magnetic field may not be able to be detected without the coil structure. The higher the generated magnetic field, the greater the Lorentz force generated by the generated magnetic field with the external magnetic field. Increasing the generated magnetic field, such as by increasing the number of turns in the coil structure, may increase the sensitivity of the magnetometer.

Various embodiments may further include a third via structure extending from the first surface 204a of the first wafer 202 to the second surface 204b of the first wafer 202. The electromechanical device may also include a multilayer metal structure on the first surface 216a of the second wafer 214. The first wafer 202 may be bonded to the second wafer 214 with the third via structure electrically connecting the multilayer metal structure. The multilayer structure may include a first layer; a conductive via on the first metal layer and a second metal layer on the conductive via. The coil structure may further include a further conductive via on the second metal layer and a third metal layer on the further conductive via. The multilayer structure may extend through a plurality of dielectric layers. The plurality of dielectric layers may be on the first surface 216a of the second wafer 214. The multilayer structure may be configured to electrically connect electrical structures (e.g. through vias) on the plurality of dielectric layers to electrical structures (e.g. metal lines, interconnects etc) on the first surface 216a. In other words, the multilayer structure provides an electrical pathway through the plurality of dielectric layers.

In various embodiments, the suspended structure 218, the first electrode 208 on the second surface 204b of the first wafer 202 and the second electrode 222 on the suspended structure 218 may be or may form any one of a lateral axis magnetometer, a differential vertical axis accelerometer, a single ended vertical axis accelerometer and a see-saw resonator.

In various embodiments, the electromechanical device may include a cavity on the second surface 204b of the first wafer 202. The electromechanical device may further include getter material within the cavity. The cavity may be a vacuum-sealed cavity.

The electromechanical device may further include a further suspended structure on the first surface 216a of the second wafer 214 within the vacuum-sealed cavity with a further spacing formed between the further suspended structure and the second surface 216b of the second wafer 214.

The further suspended structure may be any one of a vertical axis magnetometer, a lateral axis magnetometer, a differential vertical axis accelerometer, single ended vertical axis accelerometer, a lateral axis accelerometer, a fully differential lateral axis accelerometer, a vertical axis gyroscope, a lateral resonator and a see-saw resonator.

Figure 3A:
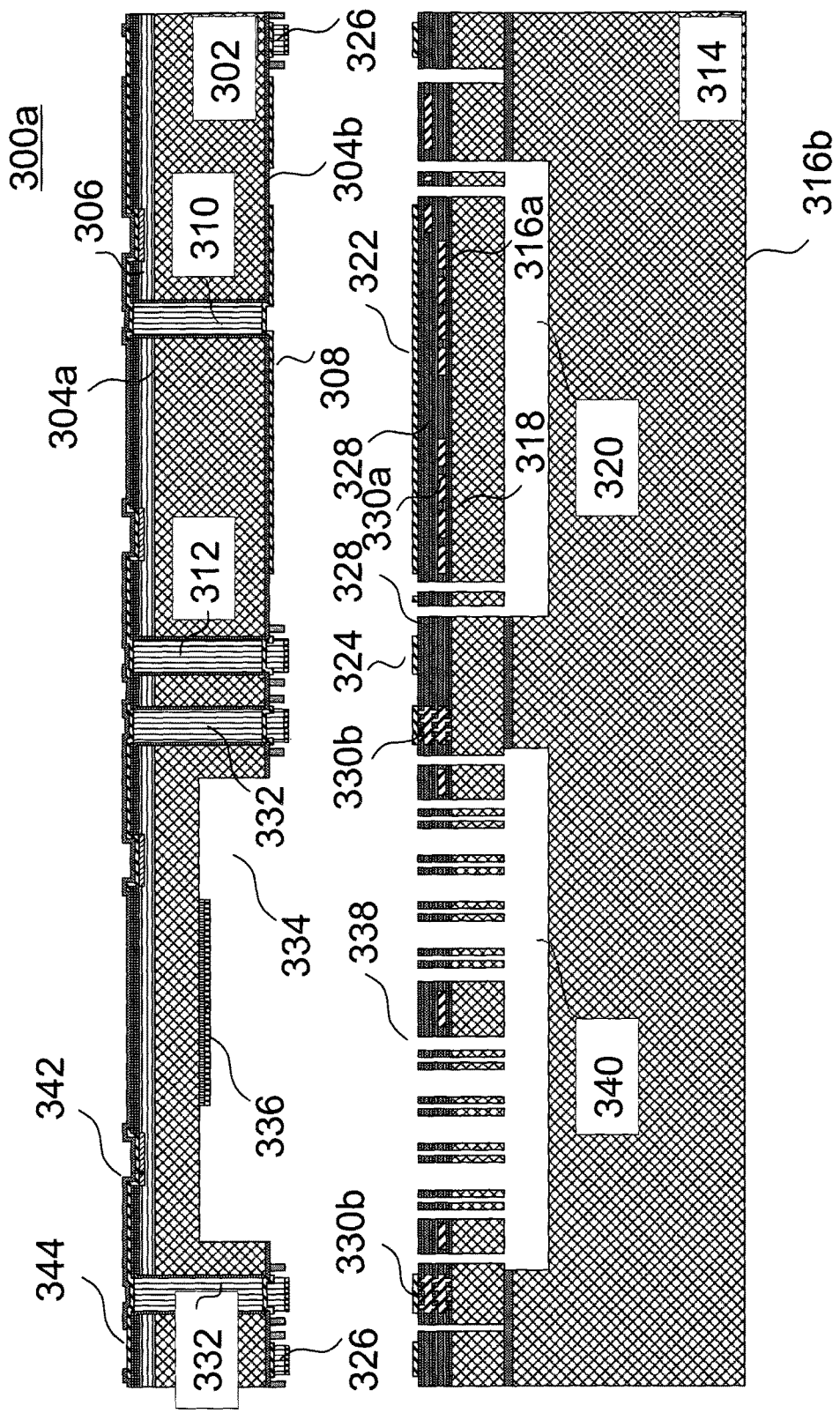
FIG. 3A is a schematic illustrating an electromechanical device according to various embodiments.

FIG. 3A is a schematic 300a illustrating an electromechanical device according to various embodiments. The electromechanical device may include a first wafer 302 having a first surface 304a and a second surface 304b opposite the first surface 304a. The electromechanical device may also include a circuit arrangement 306 on the first surface 304a of the first wafer 302. The electromechanical device may additionally include a first electrode 308 on the second surface 304b of the first wafer 302. The electromechanical device may further include a first via structure 310 extending from the first surface 304a of the first wafer 302 to the second surface 304b of the first wafer 302. The first via structure 310 may electrically connect the first electrode 308 with the circuit arrangement 306. The electromechanical device may also include a second via structure 312 extending from the first surface 304a of the first wafer 302 to the second surface 304b of the first wafer 302. The second via structure 312 may electrically connect with the circuit arrangement 306. The electromechanical device may also include a second wafer 314 bonded to the first wafer 302. The second wafer 314 may have a first surface 316a and a second surface 316b opposite the first surface 316a. The electromechanical device may additionally include a suspended structure 318 on the first surface 316a of the second wafer 314 with a spacing 320 between the suspended structure 318 and the second surface 316b of the second wafer 314. The electromechanical device may further include a second electrode 322 on the suspended structure 318. The electromechanical device may also include an interconnect structure 324 on the first surface 316a of the second wafer 314. The interconnect structure 324 may electrically connect the second electrode 322. The first wafer 302 may be bonded to the second wafer 314 with the second surface 304b of the first wafer 302 facing the first surface 316a of the second wafer 314. The second via structure 312 may electrically connect the interconnect structure 324. The first electrode 308 and the second electrode 322 may form a capacitive structure.

The first wafer 302 may be called a complementary metal oxide semiconductor (CMOS) wafer. The second wafer 314 may be called a microelectromechanical structure (MEMS) wafer. The first electrode 308 may be referred to as the top electrode. The second electrode 322 may be referred to as the bottom electrode.

Various embodiments provide a three dimensional inertial MEMS platform by bonding the MEMS wafer 314 and the CMOS wafer 302 together. During bonding of wafers 302, 314, the spacing between the top electrode 308 and bottom electrode 322 may be important as the spacing directly determines the sensitivity of the vertical axis sensors. The bonding process may include "Precise Gap Control Technique" or any other techniques.

Various embodiments may further' include one or more sealing structures 326 between the first wafer 302 and the second wafer 314. Sealing of the various cavities may be achieved by using sealing structures 326 such as sealing rings. The sealing structures may be placed on the second surface 304b of the first wafer 302 or on the first surface 316a of the second wafer 314 or both. The sealing structures 326 may be arranged or designed such that some of the cavities may be enclosed in vacuum condition while other cavities may be ventilated.

The first electrode 308 may be metal lines or pads deposited on the second surface 304b of the first wafer 302. The first electrode 308 may be the top electrode of a vertical sensing device. The circuit arrangement 306 may be or may include one or more electrical pads on the first surface 304a of the first wafer 302. The first electrode 308 may be in electrical connection to the one or more electrical pads through a through via structure 310. The through via structure 310 may be a through silicon via (TSV).

Various embodiments may take up less space compared to other solutions in which the first electrode 308 (i.e. the top electrode) is formed on a third separate wafer, or in which the first electrode 308 (i.e. the top electrode) is formed on the second wafer 314 (e.g. the MEMS wafer) together with the second electrode 322 (i.e. the bottom electrode). Various embodiments may take up less area on the first surface 304a of the first wafer 302 compared to solutions in which the first electrode 308 (i.e. the top electrode) is formed on the first surface 304a of the first wafer 302 (e.g, the CMOS wafer) together with the circuit arrangement 306, and the area saved may be used for placement of the circuit arrangements 306 (i.e. electrical circuit). Various embodiments remove the necessity of bonding more than 2 wafers for the vertical axis sensors.

The second electrode 322 may be metal lines or pads. The second electrode 322 may be deposited on a plurality of dielectric layers 328. The plurality of dielectric layers 328 may be on first surface 316a of second wafer 314. The plurality of dielectric layers 328 may include a coil structure 330a. Various embodiments may further include a coil structure 330a on the first surface 316a of the second wafer 314. The coil structure 330a may be on the suspended structure 318. The coil structure 330a may be part of a magnetometer. The coil structure 330a may alternatively or additionally be on other portions of the first surface 316a. The coil structure 330a may be embedded in the plurality of dielectric layers 328. The coil structure 330a may include a plurality of concentric rings. The coil structure 330a may be a single metal layer of concentric rings between a first dielectric layer and a second dielectric layer of the plurality of dielectric layers 328. Alternatively, the coil structure 330a may include a plurality of metal layers. Each metal layer of the plurality of metal layers may be separated by a dielectric layer. The coil structure 330a may be under the second electrode 322. The coil structure 330a may extend through the plurality of dielectric layers 328.

In other words, various embodiments may further include a coil structure 330a on the first surface 316a of the second wafer 314. The coil structure 330a may include a first metal layer; a conductive via on the first metal layer and a second metal layer on the conductive via. The coil structure 330a may further include a further conductive via on the second metal layer and a third metal layer on the further conductive via. The metal layers may be ring-shaped or c-shaped. The coil structure 330a may be an inductive coil.

Various embodiments may further include a third via structure 332 extending from the first surface 304a of the first wafer 302 to the second surface 304b of the first wafer 302. The electromechanical device may also include a multi-layer metal structure 330b on the first surface 316a of second wafer 314. The first wafer 302 may be bonded to the second wafer 314 with the third via structure 332 electrically connecting the multi-layer metal structure 330b. The multilayer structure 330b may include a first layer; a conductive via on the first metal layer and a second metal layer on the conductive via. The multilayer structure 330b may further include a further conductive via on the second metal layer and a third metal layer on the further conductive via. The multilayer structure 330b may extend through the plurality of dielectric layers 328. The multilayer structure 330b may be configured to electrically connect electrical structures on the plurality of dielectric layers 328 to electrical structures on the first surface 316a. The multilayer structure 330b may be configured to electrically connect electrical structures on first surface 316a of second wafer 314 to electrical structures on second surface 304b of first wafer 302, such as through via structures 332, when the first wafer 302 is bonded to the second wafer 314. The coupling of multilayer structures 330b with through via structures 332 also allows for electrical connection between first surface 304a of first wafer 302 and second surface 316a of second wafer 314.

In various embodiments, the electromechanical device may include a cavity 334 on the second surface 304b of the first wafer 302. The electromechanical device may further include getter material 336 within the cavity 334. The cavity 334 may be a vacuum-sealed cavity. The getter material 336 may be used to maintain long term vacuum stability inside the vacuum-sealed cavity 334.

In various embodiments, the electromechanical device may include one or more electromechanical structures. In various embodiments, a cavity enclosing an electromechanical structure may require vacuum while a further cavity enclosing a further electromechanical structure may not require vacuum. The cavity may be isolated from the further cavity using sealing structures 326. Cavities for electromechanical structures which do not require vacuum may be connected to the atmosphere or external environment via ventilation holes. The ventilation holes may be on the sealing rings 326 or MEMS wafer 314.

Etching a cavity 334 on the second surface 304b of the first wafer 302 may save space compared to providing a cavity of the first surface 304a of the first wafer 302. Conventional sensor packages typically have cavities on the front surface of the CMOS wafers, which occupies space which otherwise may be used to fabricate electronic circuitry and which increase overall die size. Having a cavity 334 on the second surface 304b may allow the corresponding first surface 304a for placement of the circuit arrangement 306, e.g. readout circuitry.

The electromechanical device may further include a further suspended structure 338 on the first surface 316a of the second wafer 314 within the vacuum-sealed cavity 334 with a further spacing 340 formed between the further suspended structure 338 and the second surface 316b of the second wafer 314.

The circuit arrangement 306 may include a single circuit or may include a plurality of discrete circuits. The circuit arrangement 306 may be or may include output pads for CMOS electronics 342, electrical pads 344 and/or interconnects such as redistribution lines (RDLs). The RDLs may be configured to carry currents or signals from one part of the first surface 304a to another part of the first surface 304b. The through vias 310, 312, 332 may be configured to carry currents or signals between the first surface 304a and the second surface 304b, which allows both surfaces 304a, 304b of the first wafer 302 to be bonded and stacking of multiple wafers. The stacking of multiple wafers is appealing for the industry since more compact sensors may be prepared by stacking multiple sensors on top of each other.

In various embodiments, the second wafer 314 may be a cavity silicon-on-insulator (SOI) wafer. A cavity SOI wafer may remove the necessity of a final etch release process (e.g. using isotropic etching) which is typically required when fabricating a suspended electromechanical structure. The cavities 320, 340 may already be formed during the fabrication of the cavity SOI wafer. Using a cavity SOI wafer may increase yield of fabrication by eliminating a possible stiction problem caused by wet etchants. In various other embodiments, the second wafer 314 may be a SOI wafer.

In various embodiments, the electromechanical device may include a plurality of electromechanical structures. In various embodiments, the electromechanical device may include a first electromechanical structure and a second electromechanical structure. The first electromechanical structure may be a magnetometer and the second electromechanical structure may be an accelerometer or a gyroscope.

In various embodiments, the electromechanical device may include at least one accelerometer, at least one gyroscope and at least one magnetometer. Various embodiments may provide the fabrication of at least one accelerometer, at least one gyroscope and at least one magnetometer in a single process flow.

Various embodiments may provide the fabrication of at least one three-axis accelerometer, at least one three-axis gyroscope and at least one three-axis magnetometer in a single process flow. Various embodiments may provide 9-axis sensing on a single platform.

Three accelerometers and three gyroscopes may be fabricated on the same substrate using MEMS fabrication techniques for conventional 6-axis sensors. These techniques may employ three wafers. The wafers may include the MEMS wafer, the CMOS readout wafer and a separate wafer for the vertical electrode.

Various embodiments which include coil structures may enhance the performances of lateral and vertical magnetometers and allow magnetometers to be formed on the same platform with gyroscopes and/or accelerometers.

Various embodiments may include only two wafers, i.e. the CMOS and MEMS wafers 302, 314. Various embodiments may allow all three different inertial MEMS sensors, i.e. accelerometers, gyroscopes and magnetometers to be implemented together using the same platform. Various embodiments may further include passive components, pressure sensors, resonators and/or any other components to be implemented on the same platform.

FIG. 3B is a table 300b illustrating the electromechanical structures that include various features according to various embodiments. The table 300b may be divided into columns 346a, 346b, 346c, 346d, 346e, 346f, 346g and rows 348a, 348b, 348c, 348d, 348e, 348f, 348g, 348h, 348i.

The 3-layer metal feature referred to in column 346c may be a coil structure or a multi-layer structure. The TSV feature referred to in column 346d may be a through via structure. The getter feature referred to in column 346e may be a getter material. The top electrode feature referred to in column 346f may be a top electrode on a first wafer and a bottom electrode on a second wafer. The vacuum feature referred to in column 346g may be a vacuum-sealed cavity.

As highlighted in FIG. 3B, a vertical axis magnetometer may include any one or more of a coil structure, a through via structure, a getter and a vacuum-sealed cavity. The vertical axis magnetometer may move laterally and may have a lateral measurement axis.

Figure 3C:
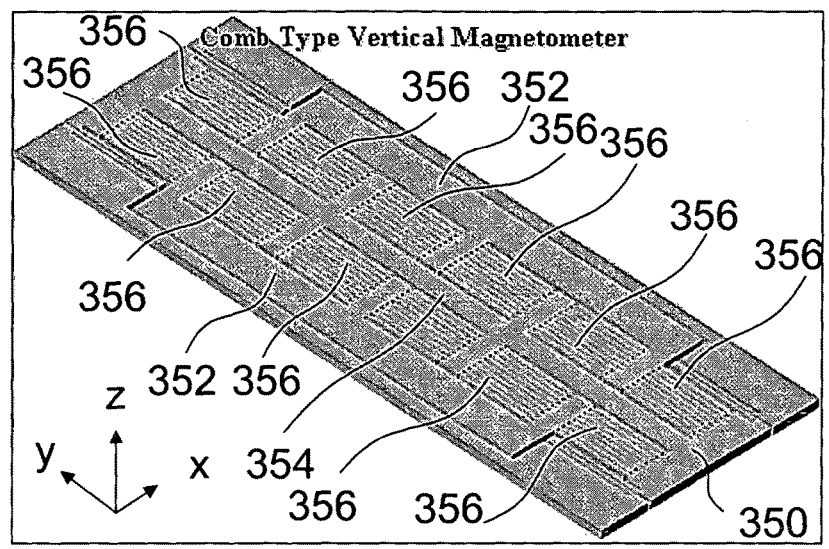
FIG. 3C is a schematic illustrating the operation of a vertical axis magnetometer according to various embodiments.

FIG. 3C is a schematic 300c illustrating the operation of a vertical axis magnetometer according to various embodiments. The vertical axis magnetometer may include a movable structure 350 and a fixed portion 352. The movable structure 350 may include a suspended structure such as a central mass structure. The vertical axis magnetometer may further include metal lines 354 on the movable structure 350. The metal lines 354 may run along a first direction (e.g. along y axis). The vertical axis magnetometer may further include one or more comb fingers 356. The comb fingers 356 may be on the fixed portion 352. The comb fingers 356 on fixed portion 352 may form a capacitive structure with movable central mass 350 (e.g. fingers on movable central mass 350). A current may flow along the metal lines 354 along the y-axis. The current may be an alternating current. The application of an external magnetic field along the z-axis may cause a Lorentz force on the movable structure along the x-axis. The movement of the movable structure 350 may cause the gap between the comb fingers 356 and movable central mass 350 (e.g. fingers on movable central mass 350) to vary, thus causing a change in capacitance which may be detected. The vertical axis accelerometer may sense magnetic field along the z-axis. The vertical axis accelerometer may further include one or more coil structures. The coil structure may be configured to generate a magnetic field. The magnetic field generated by the coil structure may interact with an external magnetic field. The interaction of the magnetic field and the external magnetic field may generate a Lorentz force. The metal lines 354 may be the one or more coil structures.

A lateral axis magnetometer may include a coil structure, a through via structure, a getter, a top electrode on a first wafer and a bottom electrode on a second wafer, and a vacuum-sealed cavity. The lateral axis magnetometer may move in a see-saw manner and may have a lateral measurement axis.

Figure 3D:
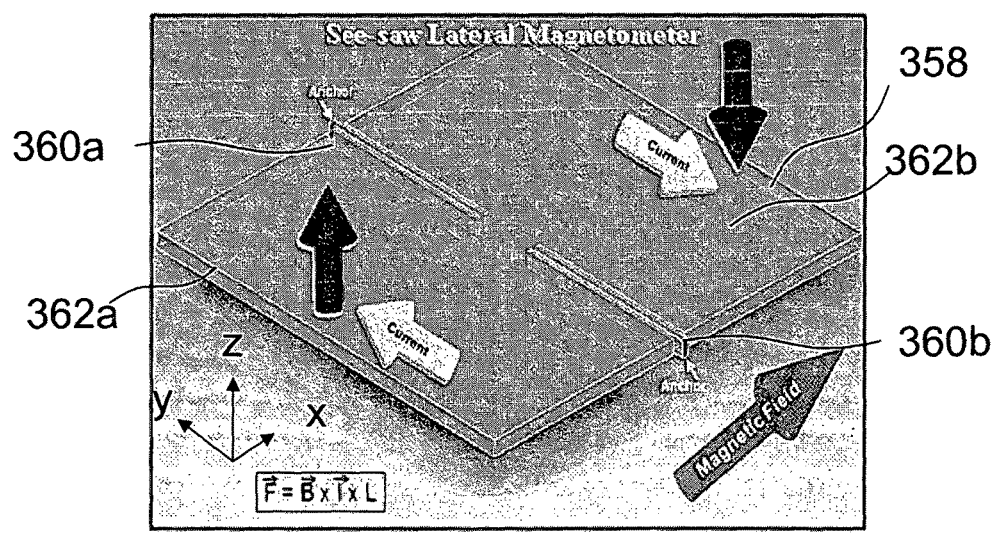
FIG. 3D is a schematic illustrating the operation of a lateral axis magnetometer according to various embodiments.

FIG. 3D is a schematic 300d illustrating the operation of a lateral axis magnetometer according to various embodiments. The lateral magnetometer may include a suspended structure 358 such as a proof mass. The suspended structure may be held by anchoring structures 360a, 360b on a first lateral side and a second lateral side opposite the first lateral side. The suspended structure may be held by anchoring structures 360a, 360b to a fixed portion of the second wafer (not shown in FIG. 3D). The suspended structure 358 may be divided into two portions 362a, 362b. A first current may be applied in a first direction (e.g. positive y direction) in first portion 362a and a second current may be applied in a second direction (opposite the first direction, e.g. negative y direction) in second portion 362b. An external magnetic field may be applied in a third direction substantially perpendicular to the first and second directions (e.g. positive x direction). The interaction of the currents and the magnetic field may cause a Lorentz force on the first portion 362a to move the first portion 362a in a fourth direction (e.g. positive z direction). The interaction of the currents and the magnetic field may also cause a Lorentz force on the second portion 362b to move the second portion 362b in a fifth direction (e.g. negative z direction). The lateral axis magnetometer may move in a see-saw manner. The lateral axis magnetometer may sense magnetic field along the x-axis. The lateral axis magnetometer may further include a coil structure having one or more layers of metal layers on the suspended structure 358. One metal layer may be separated from another layer by one or more dielectric layers. The greater the number of metal layers, the greater the Lorentz force generated.

In various embodiments, the electromechanical device may include a vertical axis magnetometer configured to measure a magnetic field along the z axis. The electromechanical device may further include a first lateral magnetometer configured to measure a magnetic field along the x axis and a second lateral magnetometer configured to measure a magnetic field along the y axis. The operation of the first lateral magnetometer may be substantially similar to the operation of the second lateral magnetometer. Likewise, the structure of the first lateral magnetometer may be substantially similar to the structure of the second lateral magnetometer. The placement orientation of the first lateral magnetometer may be different from the placement orientation of the second lateral magnetometer. The first lateral magnetometer may be oriented at about 90 degrees clockwise or anticlockwise to the second lateral magnetometer.

FIG. 3B further illustrates that a differential vertical axis accelerometer (may also be referred to as a see-saw accelerometer) may include any one or more of a through via structure, and a top electrode on a first wafer as well as a bottom electrode on a second wafer. In addition, the differential vertical accelerometer may optionally have any one or more of a getter material and a vacuum-sealed cavity. The differential vertical axis accelerometer may move in a see-saw manner and may have a vertical measurement axis. Accelerometers may use the deflection of any proof mass in presence of an acceleration phenomenon as its principle of operation.

Figure 3E:
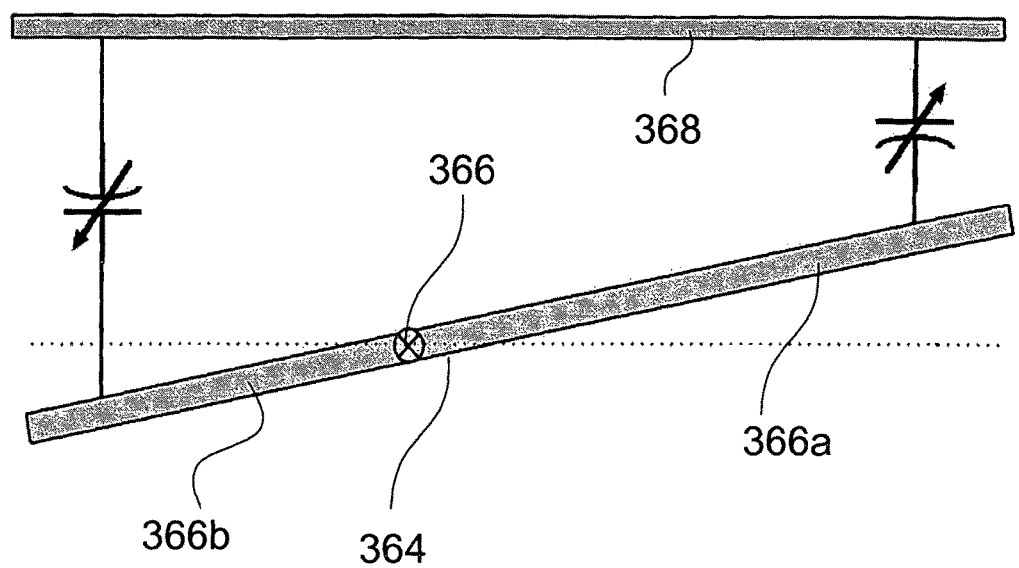
FIG. 3E is a schematic illustrating the operation of a differential accelerometer according to various embodiments.

FIG. 3E is a schematic 300e illustrating the operation of a differential accelerometer according to various embodiments. A differential accelerometer may include a see saw structure 364 on the first side of the second wafer. The structure 364 may move like a see saw around a central rotation axis 366. The mass distribution about rotation axis 366 may be asymmetrical. The asymmetrical distribution of mass allows the structure 364 to respond to an incoming acceleration. As shown in FIG. 3E, a first portion 366a of the structure (the first portion 366a extending from axis 366 to a first side) may have more mass compared to a second portion 366b of the structure 364 (the second portion 366b extending from axis 366 to a second side). Therefore more force is generated the first portion 366a in response to the acceleration compared to the second portion 366b. The differential accelerometer may further include an electrode 368 positioned at a distance from structure 364. The electrode 368 may form a first capacitive structure with first portion 366a. The electrode 368 may form a second capacitive structure with second portion 366b. When the portion 366a of see saw structure 364 moves closer to electrode 368 due to a higher force on portion 366a, the capacitance value of the first capacitive structure may increase while the capacitive value of the second capacitive structure may decrease. With the help of an electrical circuit, the difference between the capacitance values may be converted to electrical voltage which can be sensed. The electrode 368 may be the top or first electrode. The bottom or second electrode may be the first and second portions 366a, 366b which from separate capacitive structures with the electrode 368.

A single-ended vertical axis accelerometer may include any one or more of a through via structure, and a top electrode on a first wafer as well as a bottom electrode on a second wafer. In addition, the single-ended vertical axis accelerometer may optionally have any one or more of a getter material and a vacuum-sealed cavity. The single-ended vertical axis accelerometer may move vertically and may have a vertical measurement axis.

Figure 3F:
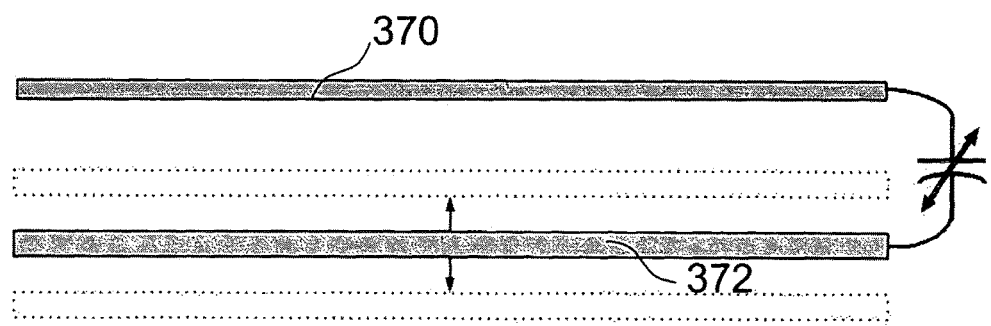
FIG. 3F is a schematic illustrating the operation of a single-ended vertical axis accelerometer according to various embodiments.

FIG. 3F is a schematic 300f illustrating the operation of a single-ended vertical axis accelerometer according to various embodiments. The single-ended vertical axis accelerometer may include a fixed electrode 370 and a movable electrode 372. The movable electrode 372 may be substantially parallel to the fixed electrode 370. The fixed electrode 370 and the movable electrode 372 to form a capacitive structure. The movable electrode 372 may be configured to move relative to the fixed electrode 370 in response to acceleration. The capacitive value of the capacitive structure may increase with a positive acceleration and decrease with a negative acceleration. The top or first electrode may be the fixed electrode 370. The bottom or second electrode may be the movable electrode 372.

A lateral axis accelerometer may include a through via structure. In addition, the lateral axis accelerometer may optionally have any one or more of a getter material and a vacuum-sealed cavity. The lateral axis accelerometer may move laterally and may have a lateral measurement axis.

Figure 3G:
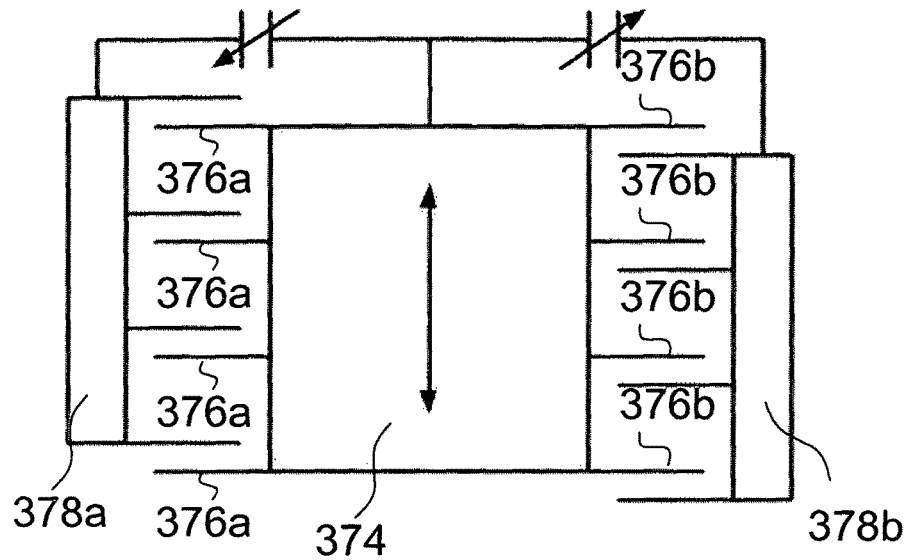
FIG. 3G is a schematic illustrating the operation of a lateral axis accelerometer according to various embodiments.

FIG. 3G is a schematic 300g illustrating the operation of a lateral axis accelerometer according to various embodiments. FIG. 3G is a top planar view of the lateral axis accelerometer. The lateral axis accelerometer may include a suspended movable structure 374 having a first lateral side and a second lateral side opposite the first lateral side. A first plurality of fingers 376a may extend from the first lateral side and a second plurality of fingers 376b may extend from the second lateral side. The lateral axis accelerometer may include fixed first comb fingers 378a and fixed second comb fingers 378b. The first plurality of fingers 376a may form a first plurality of capacitive structures with first comb fingers 378a. The second plurality of fingers 376b may form a second plurality of capacitive structures with second comb fingers 378b. The movable structure 374, the first comb fingers 378a and the second comb fingers may be arranged so that when an acceleration moves the movable structure in a direction parallel to the comb fingers 378a, 378b, the capacitive value of only one of the first plurality of capacitive structures and the second plurality of capacitive structure may increase while the capacitive value of the remaining plurality of capacitive structure may decrease. The movable structure 374, the first comb fingers 378a and the second comb fingers may be arranged such that the comb fingers 378a is spaced in a first lateral direction from the first plurality of fingers 376a while the second comb fingers 378b is spaced in a second lateral direction from the second plurality of fingers 376b, the second lateral direction opposite the first lateral direction. The difference of the capacitance values may be converted to voltage with a circuit arrangement and sensed. As seen in FIG. 3G, the lateral axis accelerometer may not require the need for a top electrode and a bottom electrode.

A fully-differential lateral axis accelerometer may include any one or more of a multi-layer structure, a through via structure, a getter material and a vacuum-sealed cavity. The fully-differential lateral axis accelerometer may move laterally and may have a lateral measurement axis.

Figure 3H:
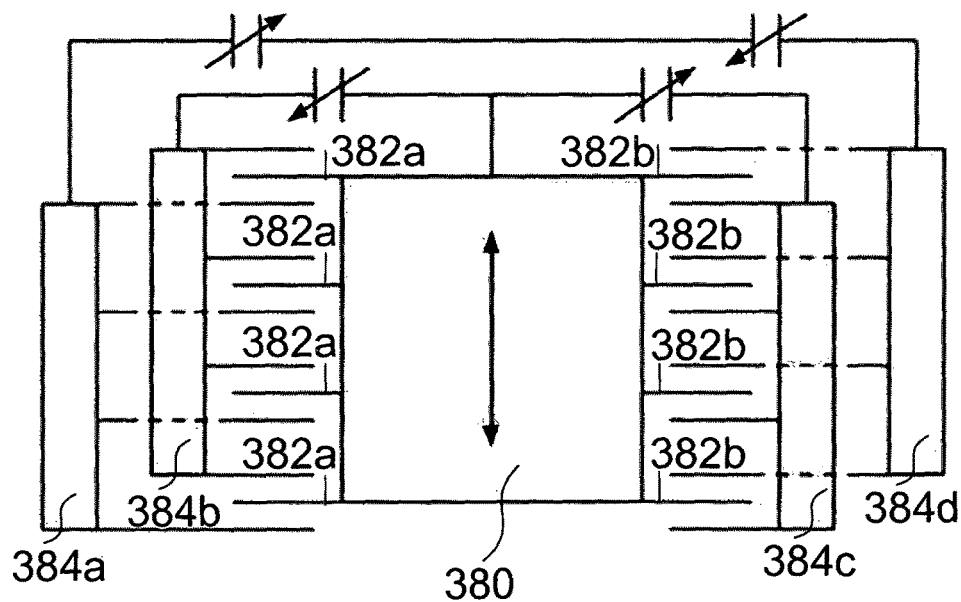
FIG. 3H is a schematic illustrating the operation of a fully-differential lateral axis accelerometer according to various embodiments

FIG. 3H is a schematic 300h illustrating the operation of a fully-differential lateral axis accelerometer according to various embodiments. FIG. 3H is a top planar view of the fully-differential lateral axis accelerometer. Similar to the lateral axis accelerometer, the fully-differential lateral axis accelerometer may move in the lateral direction. The fully-differential lateral axis accelerometer may also not require the need for a top electrode and a bottom electrode. The fully-differential lateral axis accelerometer may include a suspended movable structure 380 having a first lateral side and a second lateral side opposite the first lateral side. A first plurality of fingers 382a may extend from the first lateral side and a second plurality of fingers 382b may extend from the second lateral side. The lateral axis accelerometer may include fixed first comb fingers 384a, fixed second comb fingers 384b, fixed third comb fingers 384c and fixed fourth comb fingers 384d. The fixed first comb fingers 384a and fixed second comb fingers 384b may face the first lateral side of structure 380. The fixed third comb fingers 384c and fixed fourth comb fingers 384d may face the second lateral side of structure 380. The first comb fingers 384a may be spaced in a first lateral direction from the first plurality of fingers 382a while the second comb fingers 384b may be spaced in a second lateral direction from the first plurality of fingers 382a, the second lateral direction opposite the first lateral direction. The third comb fingers 384c may be spaced in the first lateral direction from the second plurality of fingers 382b while the fourth comb fingers 384d may be spaced in the second lateral direction from the second plurality of fingers 382b. The first comb fingers 384a may form a first plurality of capacitive structures with the first plurality of fingers 382a. The second comb fingers 384b may form a second plurality of capacitive structures with the first plurality of fingers 382a. The third comb fingers 384c may form a third plurality of capacitive structures with the second plurality of fingers 382b. The fourth comb fingers 384d may form a fourth plurality of capacitive structures with the second plurality of fingers 382b.

When acceleration causes the movable structure to move in a direction parallel to the comb fingers 384a, 384b, 384c, 384d, the capacitive value of only one of the first plurality of capacitive structures and the fourth plurality of capacitive structure may increase while the capacitive value of the remaining plurality of capacitive structure may decrease. The capacitive value of the third plurality of capacitive structures may increase or decrease with the first plurality of capacitive structures. Likewise, the capacitive value of the second plurality of capacitive structures may increase or decrease with the fourth plurality of capacitive structures. The difference of the first and fourth capacitance values may be converted to a first voltage and the difference between the second and third capacitive value may be converted to a second voltage.

As the fully-differential lateral axis accelerometer may have twice the number of capacitive structures as the lateral axis accelerometer, the fully-differential lateral axis accelerometer may also have twice the sensitivity as the lateral axis accelerometer. However, the fully-differential lateral axis accelerometer may be difficult to fabricate in a conventional process flow as the first and second comb fingers 384a, 384b should be formed at different vertical heights to avoid crossing each other. Likewise the third and fourth comb fingers 384c, 384d should be formed at different vertical heights to avoid crossing each other. Various embodiments may allow the fabrication of the fully-differential lateral accelerometer due to the multi-layer metal structure. Further, various embodiments allows connection of multiple electrical lines on the second surface of the first wafer. Various embodiments allow the flexibility of forming fully-differential lateral axis accelerometers A vertical-axis gyroscope may include any one or more of a through via structure, a getter material, and a vacuum-sealed cavity. The vertical-axis gyroscope may move laterally and may have a lateral measurement axis.

A lateral resonator may include a through via structure. In addition, the lateral axis accelerometer may optionally have any one or more of a getter material and a vacuum-sealed cavity. The lateral resonator may move laterally and may have a lateral measurement axis.

A see-saw resonator may include any one of a through via structure and a top electrode on a first wafer as well as a bottom electrode on a second wafer. In addition, the see-saw resonator may optionally have any one or more of a getter material and a vacuum-sealed cavity. The see-saw resonator may move in a see-saw manner.

In various embodiments, the suspended structure 318, the first electrode 308 on the first portion of the second surface 304b of the first wafer 302 and the second electrode 322 on the suspended structure 318 may be or may form part of a first electromechanical component. The first electromechanical component may include a first electrode 308 formed on the first wafer 302 and a second electrode formed on the suspended structure 318. In various embodiments, the suspended structure 318, the first electrode 308 on the first portion of the second surface 304b of the first wafer 302 and the second electrode 322 on the suspended structure 318 may be any one of a lateral axis magnetometer, a differential vertical axis accelerometer, a single ended vertical axis accelerometer and a see-saw resonator. The suspended structure 318, the first electrode 308 on the first portion of the second surface 304b of the first wafer 302 and the second electrode 322 on the suspended structure 318 may form a part of any one of a lateral axis magnetometer, a differential vertical axis accelerometer, a single ended vertical axis accelerometer and a see-saw resonator.

In various embodiments, the further suspended structure 338 may be or may form part of a second electromechanical component. The second electromechanical component may be enclosed in a vacuum sealed cavity 334. The further suspended structure 338 may be any one of a vertical axis magnetometer, a lateral axis magnetometer, a differential vertical axis accelerometer, single ended vertical axis accelerometer, a lateral axis accelerometer, a fully differential lateral axis accelerometer, a vertical axis gyroscope, a lateral resonator and a see-saw resonator. The further suspended structure may form a part of any one of a vertical axis magnetometer, a lateral axis magnetometer, a differential vertical axis accelerometer, single ended vertical axis accelerometer, a lateral axis accelerometer, a fully differential lateral axis accelerometer, a vertical axis gyroscope, a lateral resonator and a see-saw resonator.

Figure 4A:
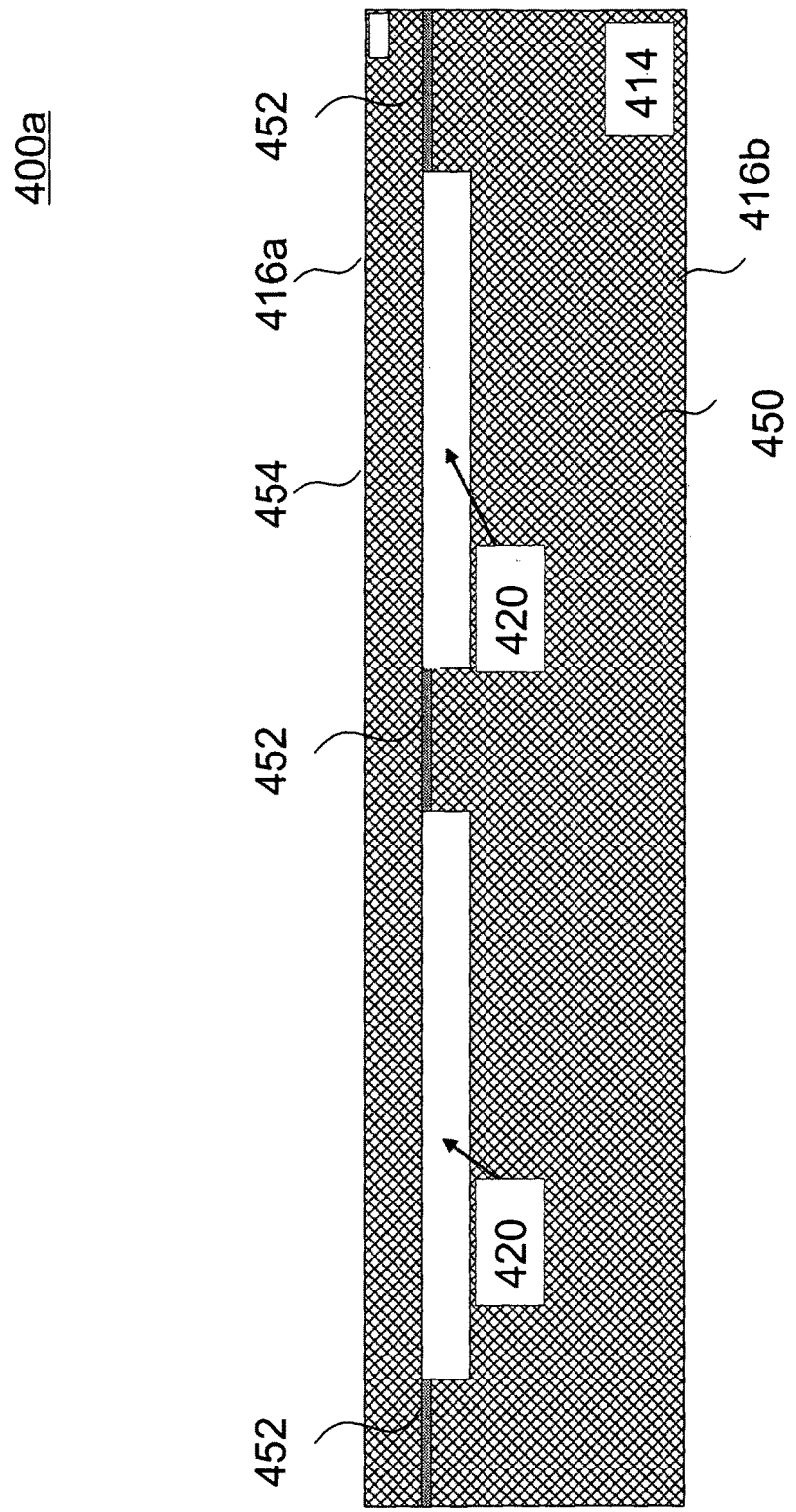
FIG. 4A is a schematic showing a method of forming a second wafer with cavities according to various embodiments.

FIGS. 4A-F illustrate a method of forming a second wafer according to various embodiments. FIG. 4A is a schematic 400*a* showing a method of forming a second wafer with cavities according to various embodiments. The second wafer with cavities may include a cavity-SOI wafer. The method may include providing a substrate 450 such as a bare silicon wafer. A masking layer 452 such as silicon dioxide mask may be formed in the substrate 450. The masking 452 may be deposited in the substrate 450 and patterned. Cavities 420 may be formed using the masking layer 452, for example by using etching. The cavities 420 may be 3-20 μm deep. The masking layer 452 may not be removed after the cavities 420 are formed but may be used as a bonding medium for fusion bonding to a further substrate 454 such as a further silicon wafer. The wafer 414 may include substrate 450 and further substrate 454. After bonding the substrate 450 and the further substrate 454, the thickness of wafer 414 may be adjusted to a desired thickness using any suitable technique. The wafer 414 may have a first surface 416*a* and a second surface 416*b* opposite the first surface 416*a*. The second wafer 414 may include a first substrate 450 and a further substrate 454 bonded to the first substrate 450 through layer 452.

Figure 4B:
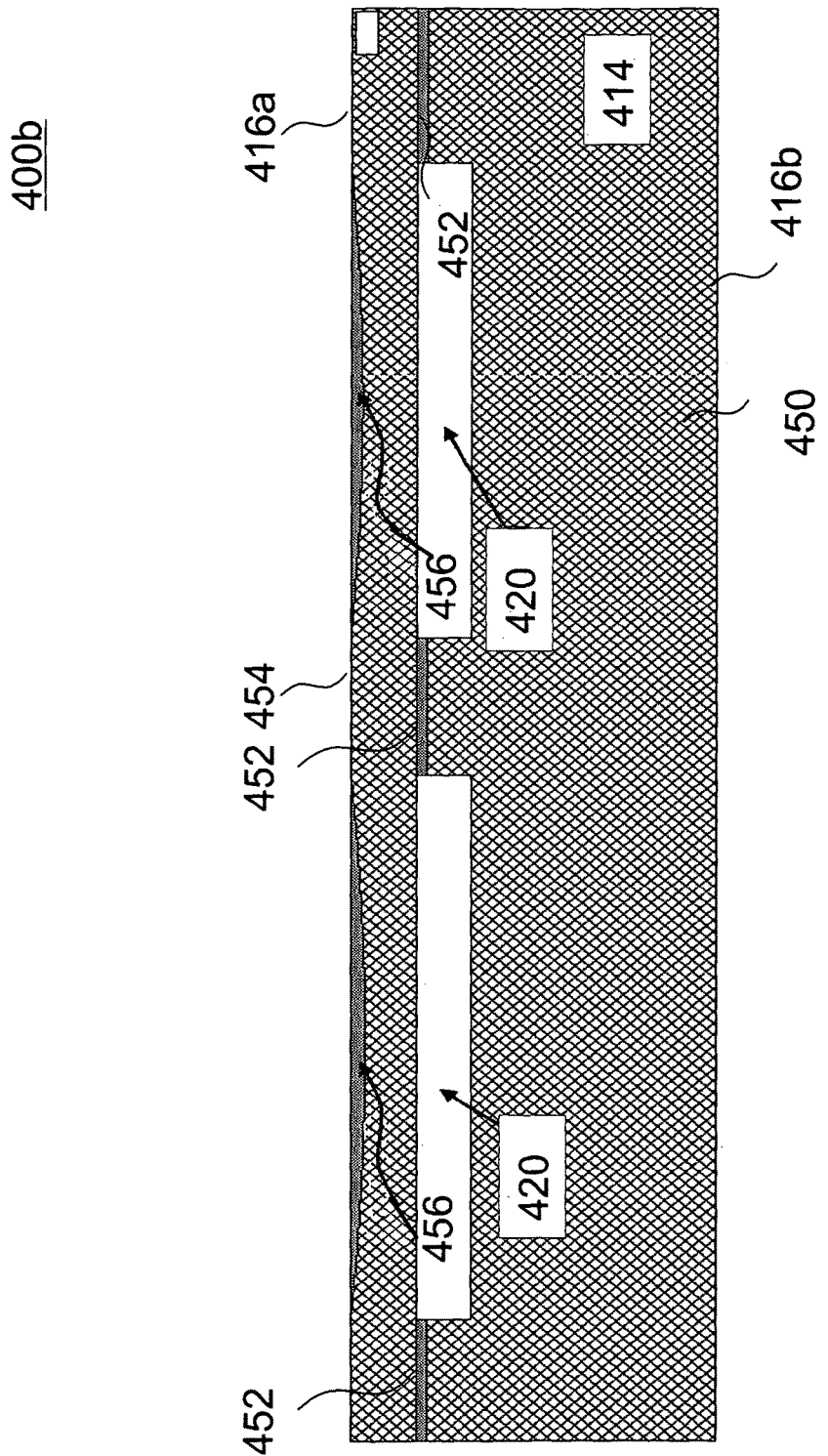
FIG. 4B is a schematic showing a method of forming a planarized first surface 416a according to various embodiments.

The cavities 420 may be sealed with fusion bonding either in vacuum or non-vacuum conditions. For both vacuum and non-vacuum conditions, there may be a bending of substrate 454 which forms a diaphragm. The bending of substrate 454 may result in surface non-uniformity of the first surface 416*a* during the fabrication of the second wafer 414. FIG. 4B is a schematic 400*b* showing a method of forming a planarized first surface 416*a* according to various embodiments. The method may include depositing a material 456 (e.g. dummy oxide deposition). The method may further include removing partially the material 456 using a suitable technique such as chemical mechanical polishing (CMP). The material 456 may address the issue of surface non-uniformity.

Figure 4C:
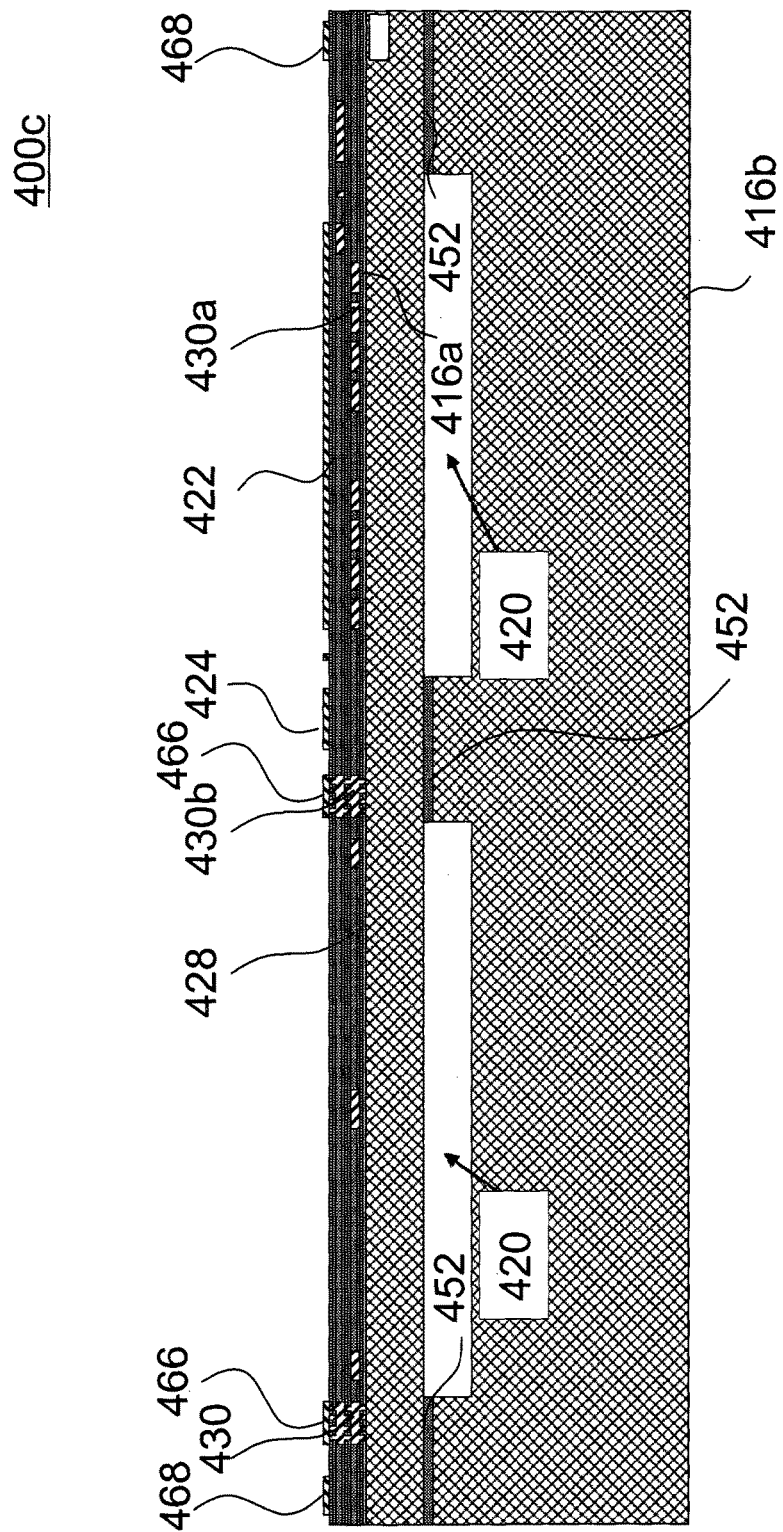
FIG. 4C is a schematic showing a method of forming a coil structure and a multilayer metal structure on a second wafer without diaphragm bending according to various embodiments.
Figure 4D:
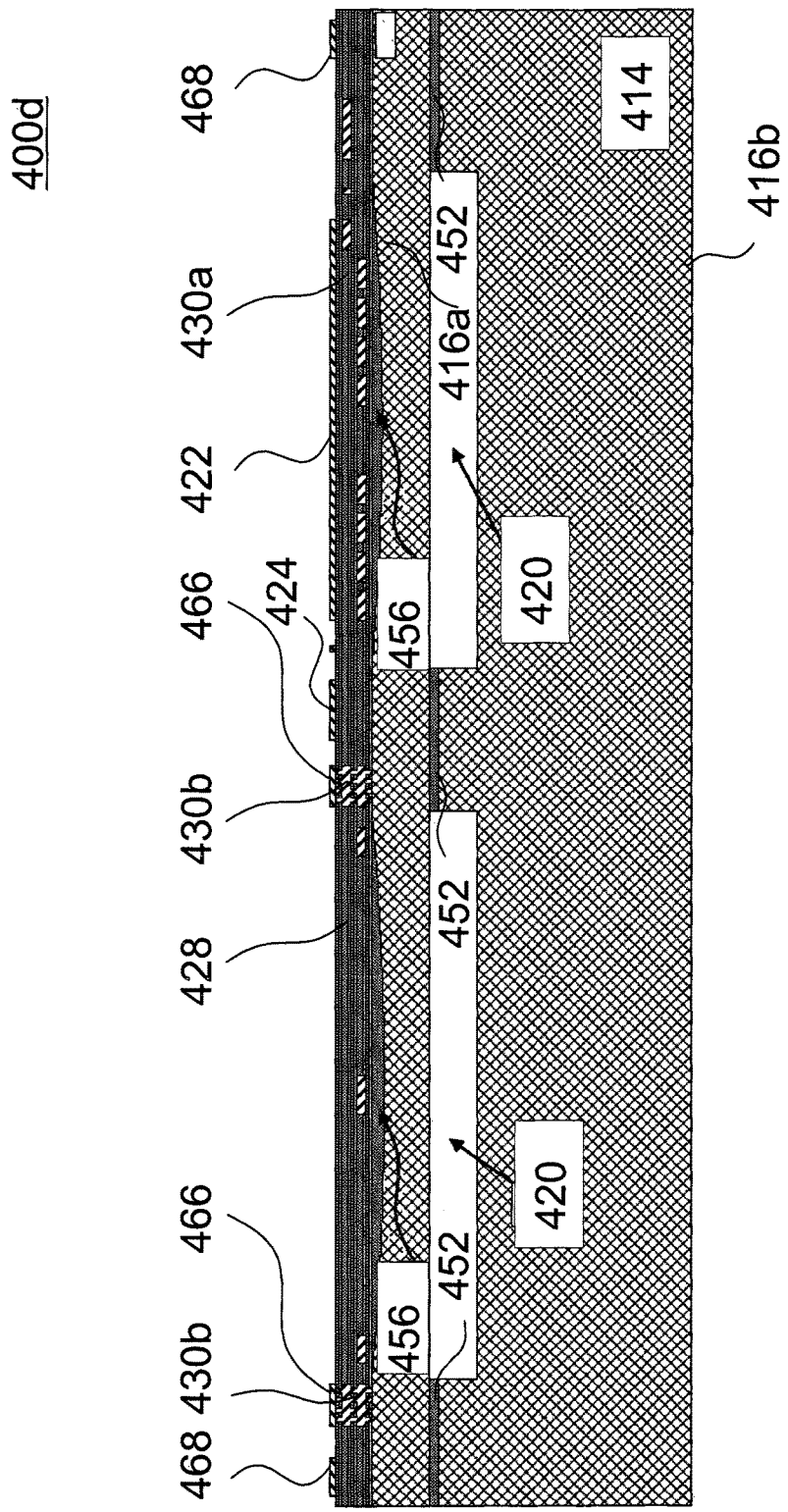
FIG. 4D is a schematic showing a method of forming a coil structure and a multilayer metal structure on a second wafer with diaphragm bending according to various embodiments.
Figure 4E:
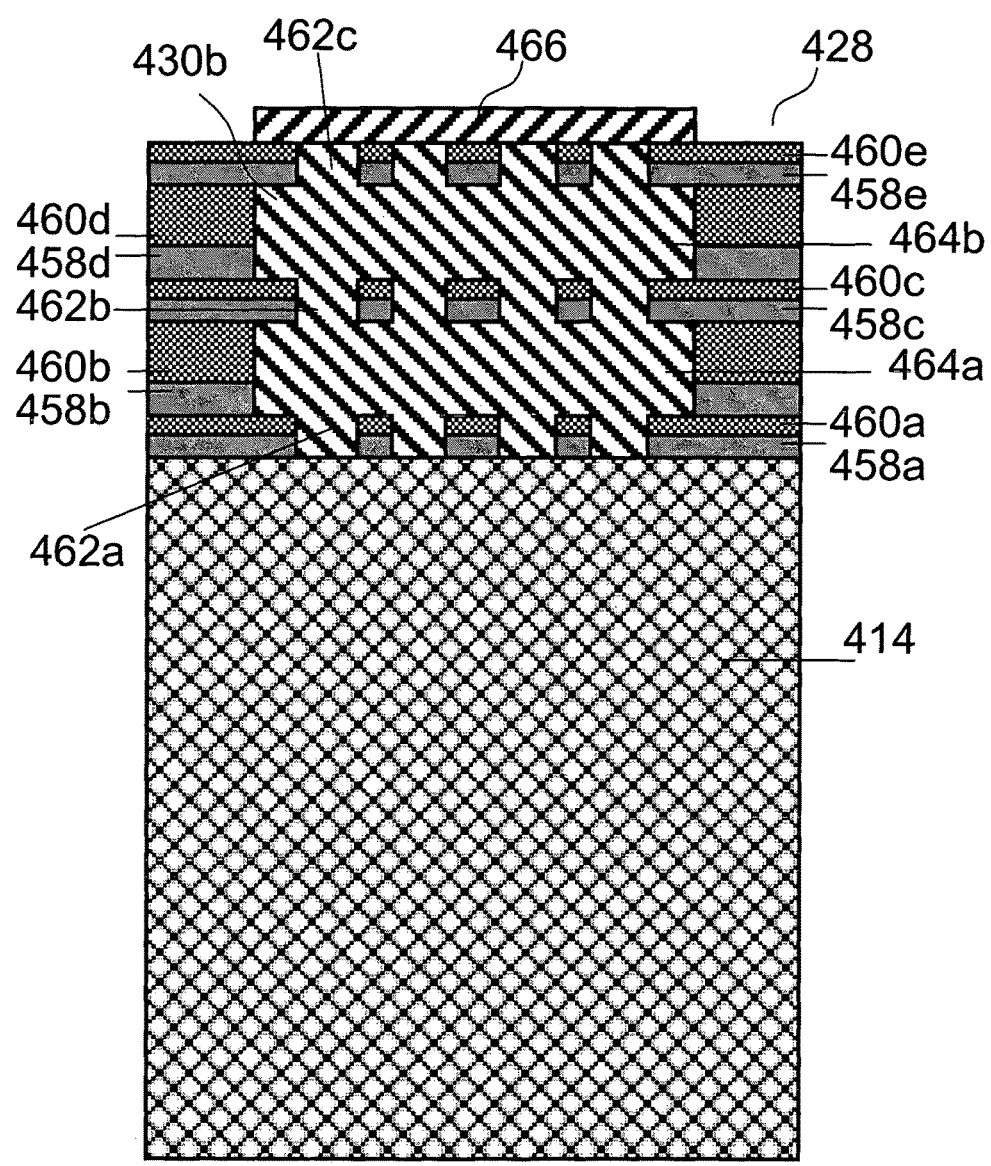
FIG. 4E is a schematic of the multilayer metal structure according to various embodiments.

FIG. 4C is a schematic 400*c* showing a method of forming a coil structure 430*a* and a multilayer metal structure 430*b* on a second wafer 414 without diaphragm bending according to various embodiments. FIG. 4D is a schematic 400*d* showing a method of forming a coil structure 430*a* and a multilayer metal structure 430*b* on a second wafer 414 with diaphragm bending according to various embodiments. FIG. 4E is a schematic 400*e* of the multilayer metal structure 430*b* according to various embodiments. The method may include depositing a plurality of dielectric layers 428 on the second wafer 414. The method may also include forming a coil structure 430*a*. The coil structure may include one or more metal layers embedded between the plurality of dielectric layers 428. A metal layer may be separated from a second metal layer by one or more dielectric layers. The method may also include forming a multilayer metal structure 430*b* on the plurality of dielectric layers 428. The multilayer metal structure 430*b* may extend through the dielectric layers. The method of forming the multilayer metal structure 430*b* may include a dual damascene process. In various embodiments, the coil structure 430*a* and the multilayer metal structure 430 may be formed using the same process steps.

A first dielectric layer 458*a* may be deposited on the second wafer 414. A second dielectric layer 460*a* may be deposited on the first dielectric layer 458*a*. The first dielectric layer 458*a* and the second dielectric layer 460*a* may be etched using a dark field (clear feature) mask. Seed copper deposition may be carried out followed by a copper electroplating process and a CMP process to remove the excess copper to form first vias 462*a*.

Subsequently, a third dielectric layer 458*b* may be deposited on the second dielectric layer 460*a*. A fourth dielectric layer 460*b* may be deposited on the third dielectric layer 458*b*. The third dielectric layer 458*b* and the fourth dielectric layer 460*b* may be etched using a dark field (clear feature) mask. Seed copper deposition may be carried out followed by a copper electroplating process and a CMP process to remove the excess copper to form metal layer 464*a*.

Subsequent dielectric layers 458*c*, 460*c*, 458*d*, 460*d*, 458*e*, 460*e* may be deposited and etched to form second vias 462*b*, second metal layer 464*b*, third vias 462*c*. Finally, a metal such as aluminum may be deposited to form metal layer 466. A bottom electrode 422 (i.e. the second electrode) and/or interconnect structure 424 may be formed on the second wafer 414 at the same time as the metal layer 466 is formed. Additionally, bonding pad 468 for sealing rings may also be formed at the same time as the metal 466. In other words, a metal layer deposited on the second wafer 414 may be formed into metal layer 466, interconnect structure 424, bottom electrode 422 and/or bonding pad 468.

The dielectric layers 458*a*, 458*b*, 458*c*, 458*d*, 458*e* may include a first material such as silicon nitride. The dielectric layers 460*a*, 460*b*, 460*c*, 460*d*, 460*e* may include a second material such as silicon dioxide. Each material may be used as a stopping layer for the other material during reactive etching process. For instance, the first material may be used as an etch stop during the etching of the second material. The second material may be used as an etch stop during the etching of the first material. The thickness of the dielectric layers may be adjusted to compensate for internal stresses. The thickness of individual silicon nitride layer may be adjusted such that the compressive stress of the silicon nitride layer may compensate or cancel the tensile stress of silicon dioxide layer on the silicon nitride layer. Correspondingly, the thickness of individual silicon dioxide layer may be adjusted such that the tensile stress of the silicon dioxide layer may compensate or cancel the compressive stress of silicon nitride layer under the silicon dioxide layer. The thickness of dielectric layers for forming vias, such as dielectric layers 458*a*, 460*a*, 458*c*, 460*c*, 458*e*, 460*e*, may be kept as small as possible while the thickness of dielectric layers for forming metal layers, such as dielectric layers 458*b*, 460*b*, 458*d*, 460*d* may be larger to decrease the overall resistance of the metal layers. The overall thickness of the multilayer metal structure 430*b* may be kept small in order to reduce the effect on the overall mechanical performance of the electromechanical structures.

The method may further include depositing bonding material on the sealing rings and/or bonding pads 468. The bonding material may be eutectic bonding material such as copper-tin, gold-tin or aluminum-germanium.

Figure 4F:
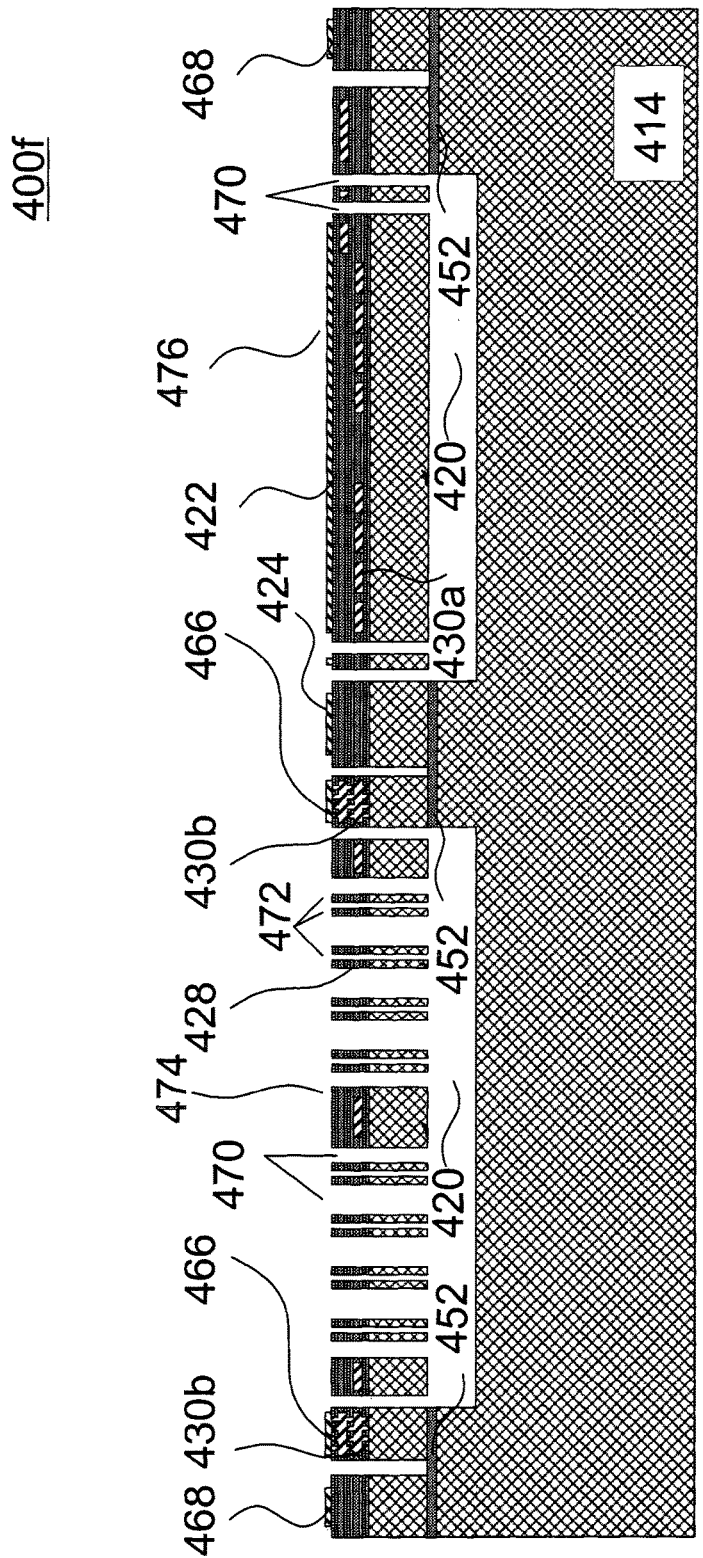
FIG. 4F is a schematic showing a method of patterning the plurality of dielectric layers.

The method may also include patterning the plurality of dielectric layers 428 using a suitable process such as reactive ion etching. FIG. 4F is a schematic 400*f* showing a method of patterning the plurality of dielectric layers 428. As shown in FIG. 4F, patterning the plurality of dielectric layers 428 may include etching through a portion of the plurality of dielectric layers 428. A plurality of trenches 470 may be formed by etching. The method may further include etching a portion of the second wafer 414 under the portion of the plurality of dielectric layers 428. The etching of the portion of the second wafer 414 may be formed by a suitable process such as deep reactive ion etching. The etching may release the electromechanical structures. Further wet etching process may not be required as the cavities 420 are formed earlier. Structures such as capacitive fingers 472, suspended laterally oscillating proof mass 474, suspended vertically oscillating proof mass 476 may be formed at the end of the etching processes.

Figure 5B:
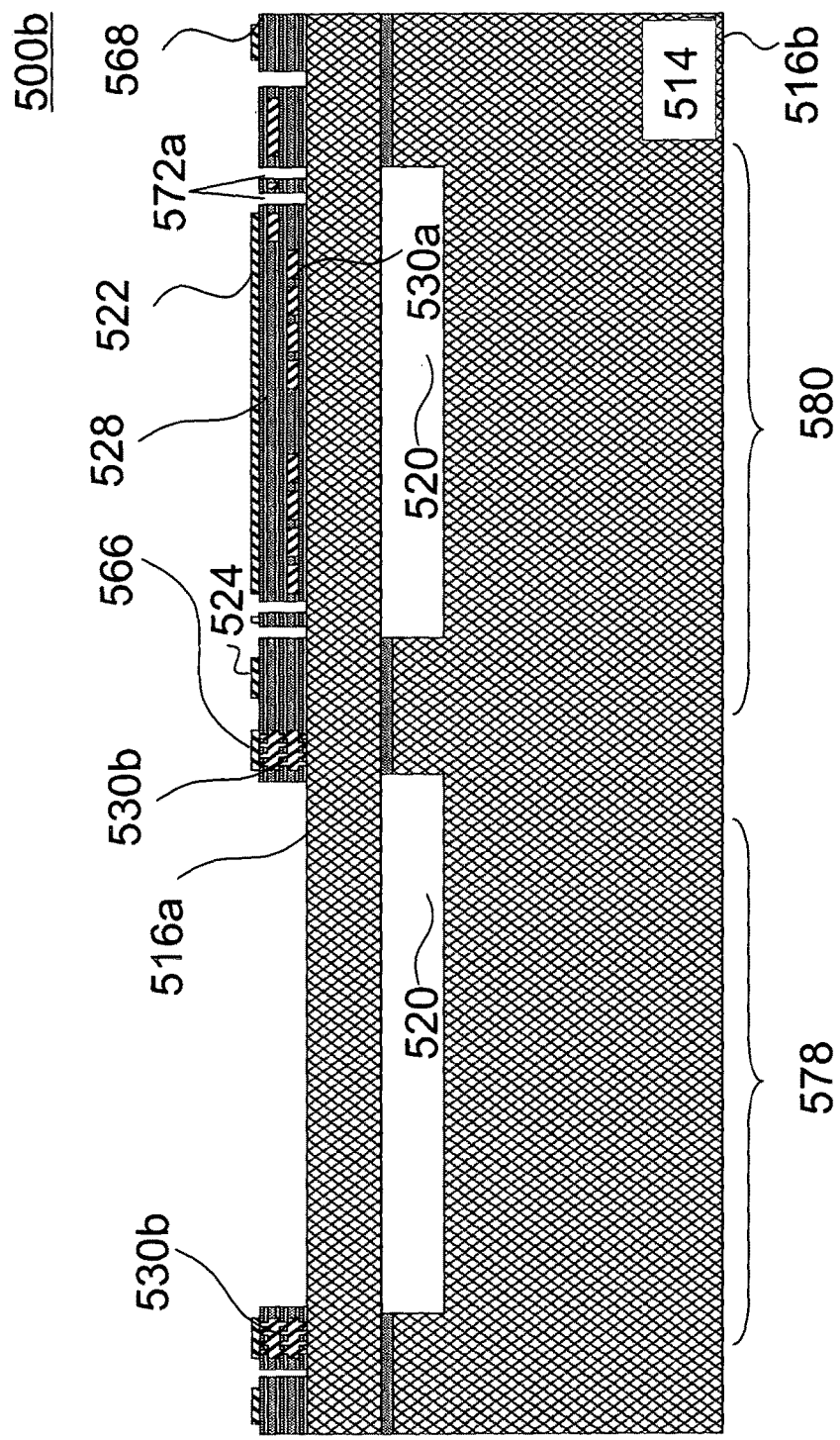
FIG. 5B is a schematic showing the portion of dielectric layers directly on portion being removed according to various embodiments.
Figure 5C:
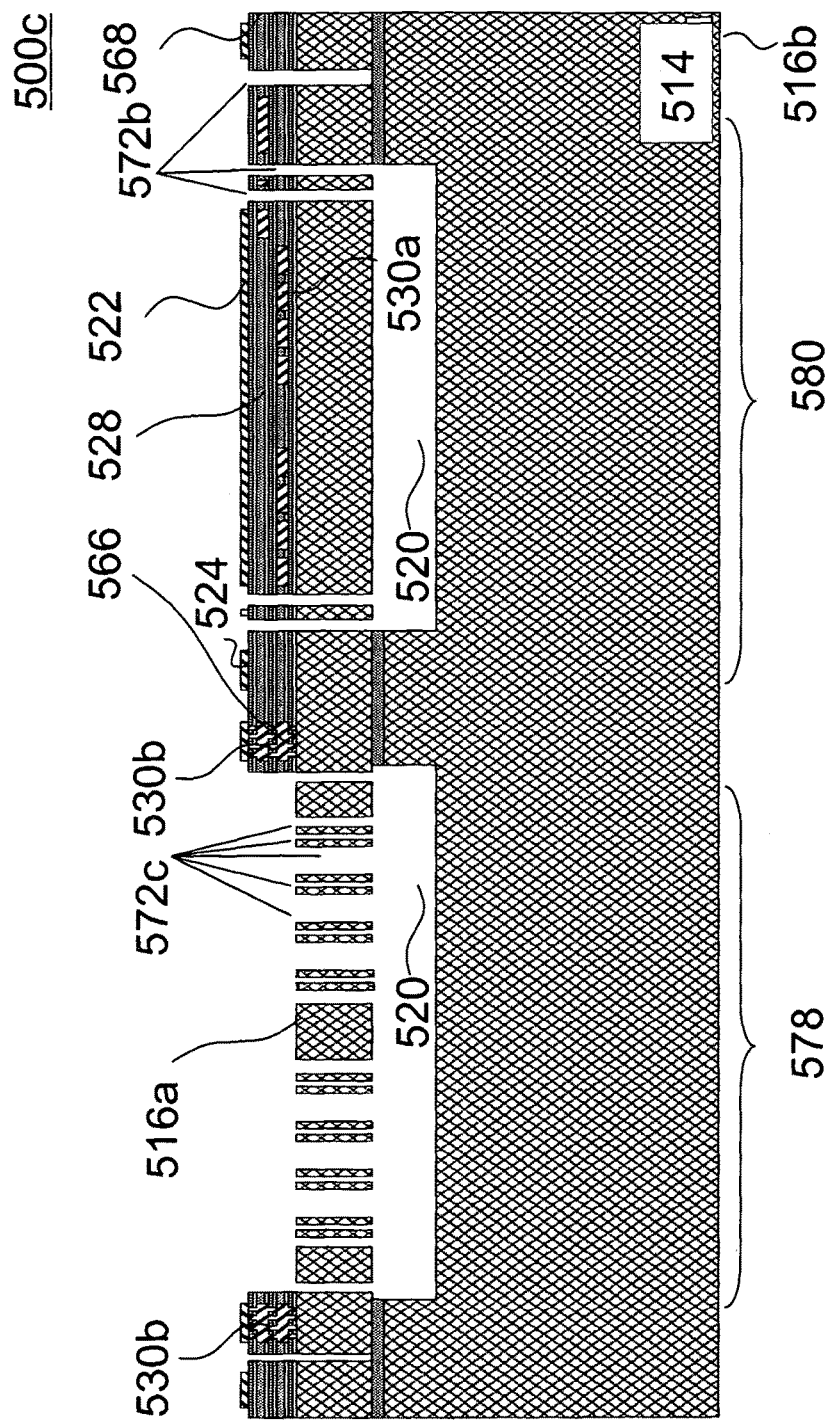
FIG. 5C is a schematic forming of trenches being formed according to various embodiments.

FIGS. 5A-C illustrate a method of forming a second wafer according to various embodiments. FIG. 5A is a schematic 500a showing a method of forming a coil structure 530a and a multilayer metal structure 530b on a second wafer 514 according to various embodiments. FIG. 5A may be similar to FIG. 4C but in which metal layers may be absent in a portion of the plurality of dielectric layers 528. The portion of the plurality of dielectric layers 428 (in which metal layers may be absent) may be on a portion 578 of the second wafer 514. The portion of the plurality of dielectric layers (in which metal layers may be absent) may be devoid of coil structure 530a and multilayer structure 530b. An electromechanical structure such as accelerometer or a gyroscope or a movable portion of a accelerometer/gyroscope may subsequently be formed on portion 578. Coil structure 530a may be formed on or within the plurality of dielectric layers 528. Multilayer metal structures 530b may be formed on the plurality of dielectric layers 528. Metal layers 466 may be formed as a part of the multilayer metal structures 530b. Bonding pads 568 and/or interconnect structures 524 may also be formed on the plurality of dielectric layers 528. Further, bottom electrode 522 may be formed on a further portion of dielectric layers 528 directly on a further portion 580 of the second wafer 514. A further electromechanical structure such as a magnetometer or a movable structure of a magnetometer may be formed on further portion 580. Metal layers and/or coil structures 530a may be formed on or embedded within the further portion of the dielectric layers 528. Metal layers and/or coil structures 530a may be formed on or embedded only within the further portion of the dielectric layers 528 and not on or embedded with portion of the dielectric layers.

FIG. 5B is a schematic 500b showing the portion of dielectric layers 528 directly on portion 578 being removed according to various embodiments. The method may include completely removing the portion of the dielectric layer 528 directly on portion 578. The portion of the dielectric layer 528 directly on portion 578 may be removed using etching. The second wafer 540 may have a first surface 516a and a second surface 516b opposite the first surface 516a. The plurality of dielectric layers 528 may be initially deposited on the first surface 516a. After the removal of the portion of the dielectric layer 528 on portion 578, the first surface 516a of portion 578 may be completely devoid of dielectric layers 528. The further portion of the dielectric layers 528 directly on further portion 580 may be patterned to form trenches 572a. However, the further portion of the dielectric layers 528 may be not completely removed. The portion of the dielectric layers 527 may be completely removed and the further portion of the dielectric layers 528 may be patterned in the same etching step.

FIG. 5C is a schematic 500c forming of trenches 572b, 572c being formed according to various embodiments. The method may further include providing a mask such as a metal cover over the first surface 516a. The remaining patterned dielectric layers 528 (of the further portion of the dielectric layers 528) may also act as a masking layer. The portion 578 may rely only on the mask for subsequent patterning. The method may include patterning the portion 578 as well as portion 580 of the first side 516a of the second wafer 514. Trenches 572a may be further formed into trenches 572b on the further portion 580. Trenches 572c may also be formed on portion 578.

Magnetometers may require metal lines and/or coil structures on the structural layers to generate a Lorentz Force by an applied magnetic field. The metal lines and/or coil structures may be on suspended structures of the magnetometers. On the other hand, gyroscopes and/or accelerometers may not require such metal lines and/or coil structures as force (for moving the movable and/or suspended structures) may be from the inertial movement of the movable and/or suspended structures. The metal lines and/or coil structures as well as dielectric layers on the suspended structures may cause additional stress for the suspended and/or movable structure of the gyroscopes and/or accelerometers, which will cause the suspended and/or movable structures to buckle after the releasing operation.

The methods illustrated in FIGS. 5A-C may reduce stress of the movable and/or suspended structures of the gyroscopes and/or accelerometers. The methods illustrated in FIGS. 5A-C may reduce stress of the movable and/or suspended structures of the gyroscopes and/or accelerometers by removing the portion of dielectric layers deposited on the gyroscopes and/or accelerometers before fabrication is completed. The portion of the dielectric layers may be removed in the same process flow as forming the electromechanical device including the various electromechanical structures. Magnetometers, which may require dielectric layers for formation of metal lines and/or coil structures on or embedded within, and accelerometers and/or gyroscopes, which may not require dielectric layers, may be fabricated side by side on the same process platform.

Figure 6A:
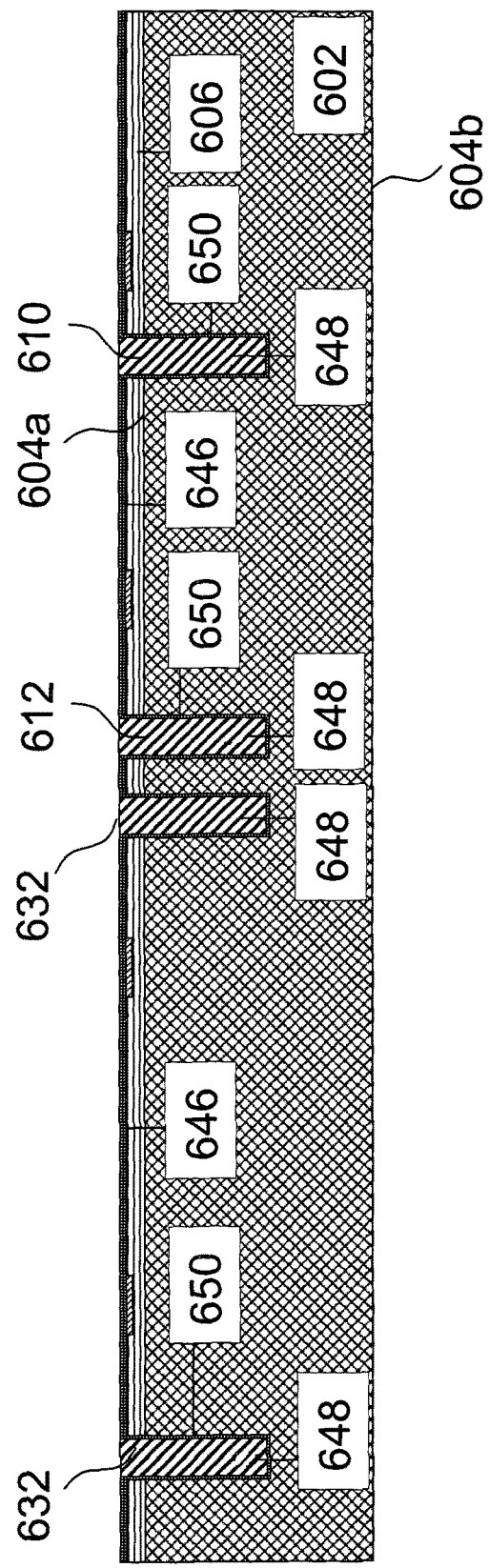
FIG. 6A is a schematic illustrating a method of forming via structures according to various embodiments on the first wafer according to various embodiments.
Figure 6B:
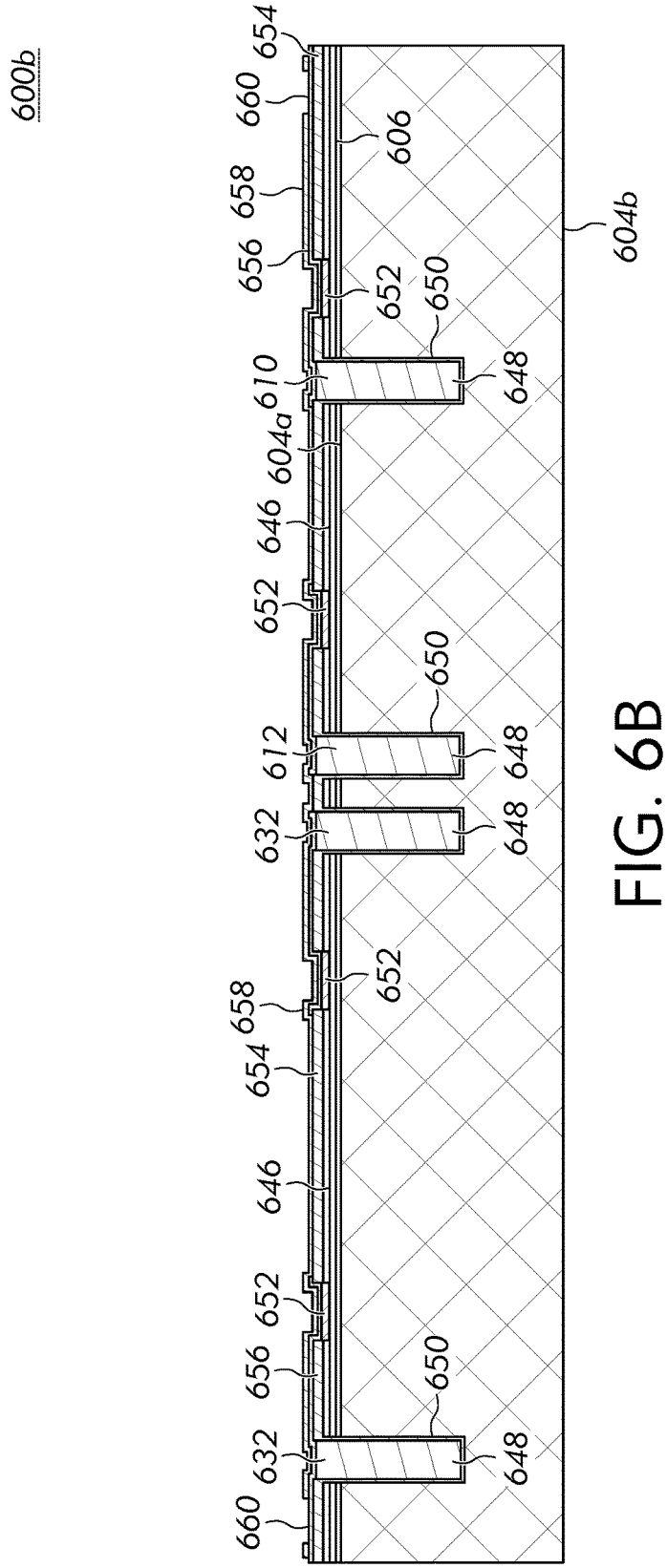
FIG. 6B is a schematic illustrating a method of forming redistribution lines (RDLs) according to various embodiments.
Figure 6C:
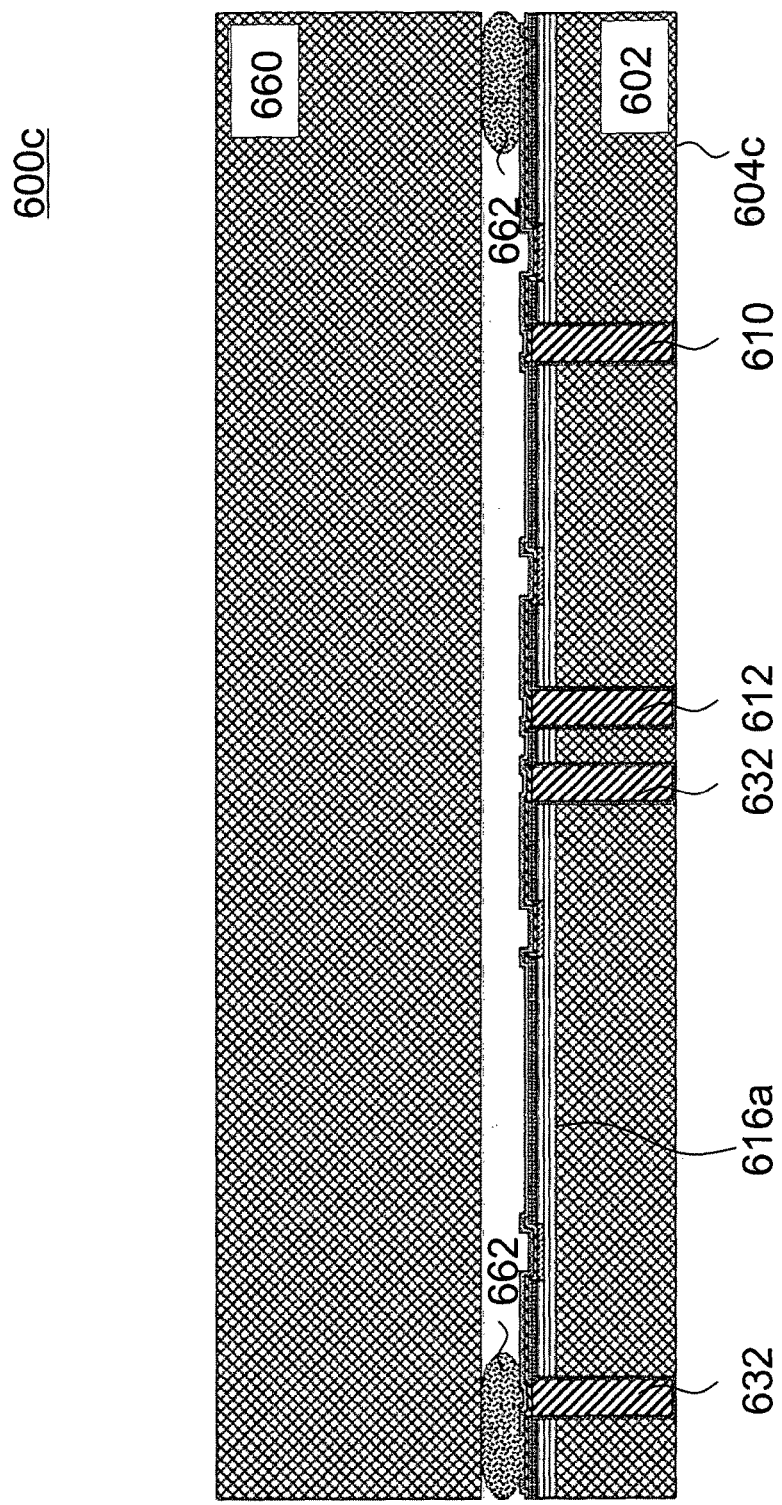
FIG. 6C is a schematic illustrating a method of thinning the first wafer according to various embodiments.

FIGS. 6A-C illustrate a method of forming a first wafer according to various embodiments. FIG. 6A is a schematic 600a illustrating a method of forming via structures 610, 612, 632 according to various embodiments on the first wafer 602 according to various embodiments. FIG. 6B is a schematic 600b illustrating a method of forming redistribution lines (RDLs) 656 according to various embodiments. A first wafer 602 may be provided. The wafer may have a original surface 604a and a further original surface 604b. A circuit 606 may be formed on the first wafer 602, i.e. on surface 604a. A first dielectric layer 646, such as an oxide insulation layer, may be deposited on or over the surface 604a of first wafer 602. The first dielectric layer 646 may be patterned. The patterned first dielectric layer 646 may be used as a mask for forming trenches 648 at predefined locations of the first wafer 602. A second dielectric layer 650 may be deposited at the side walls of trenches 648. Seed copper deposition may be carried out to form via structures 610, 612, 632. Metal pads 652 e.g. CMOS pads may also be formed. The method may further include removing the excess copper (i.e. copper deposited outside the trenches 648) in a planarization step using a suitable process such as chemical mechanical polishing (CMP).

A third dielectric layer 654 may be deposited over the first wafer 602, i.e. at least partially on the first dielectric layer 646. The third dielectric layer 654 may be patterned by a suitable process such as reactive ion etching (RIE). The third dielectric layer 654 may be patterned to expose the via structures 610, 612, 632. The third dielectric layer 654 may also be patterned to expose the metal pads 652. Redistribution lines (RDLs) 656 may be formed on the third dielectric layer 654. The redistribution lines 656 may be formed by depositing aluminum on third dielectric layer 654 and patterning the aluminum. The redistribution lines 656 may be configured to connect the via structures 610, 612, 632 and metal pads 652. The redistribution lines 656 may also be referred to as top redistribution lines. A fourth dielectric layer 658 may be deposited at least partially on the redistribution lines 656 to protect the redistribution lines 656. Top surface electrical pads 660 may be formed partially on the fourth dielectric layer 658. The circuit arrangement may include one or more of the circuit 606, the redistribution lines 656, the metal pads 652 and the electrical pads 660.

FIG. 6C is a schematic 600c illustrating a method of thinning the first wafer 602 according to various embodiments. The first wafer 602 may be bonded to a transfer wafer 660. The method may include attaching the first wafer 602 to the transfer wafer 660 with the first surface 604a of the first wafer 602 facing the transfer wafer 660. The first wafer 602 may be bonded to the transfer wafer using bonding material 662 such as temporary bond adhesive bonding material. A portion of the first wafer 602 (i.e. further original surface 604b) may be removed to form the second surface 604c of the first wafer 602. The portion of the first wafer 602 may be removed by suitable thinning processes such as etching, grinding and/or chemical mechanical polishing (CMP). The portion of the first wafer 602 may be removed such that the thickness of the first wafer 602 is down to the depth of the via structures 610, 612, 632. Through via structures may be formed from via structures 610, 612, 632 during the thinning processes. The first wafer 602 may be thinned from original surface 604b to surface 604c. CMP may be carried out for finishing with a smooth surface. The thickness of the thinned first wafer 602 may be about 300 µm for a 60 µm via diameter. As handling or processing 300 µm thick wafers may not be possible due to brittleness at such thickness, the transfer wafer 660 may be required to be attached to the first wafer 602 before thinning.

Figure 6D:
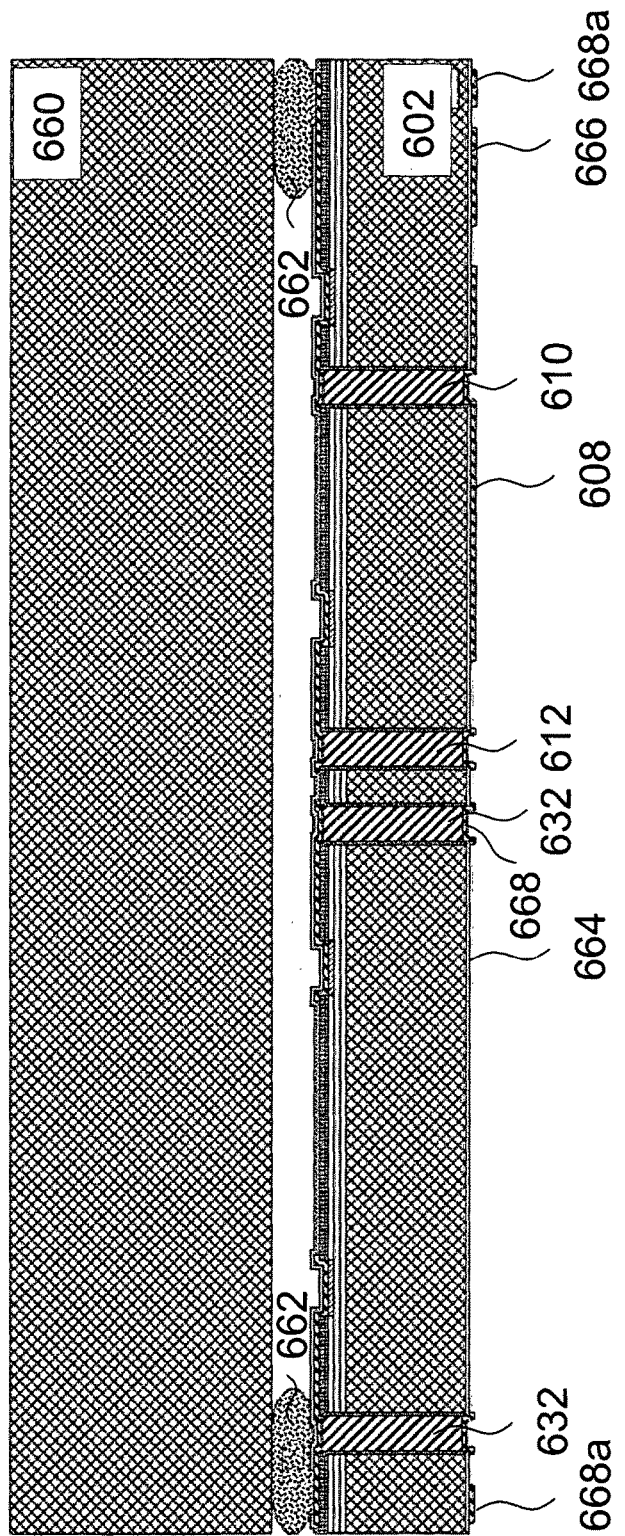
FIG. 6D is a schematic illustrating a method of processing the thinned first wafer according to various embodiments.

FIG. 6D is a schematic 600d illustrating a method of processing the thinned first wafer 602 according to various embodiments. An isolation layer 664 may be deposited on the second surface 604c of the first wafer 602. The isolation layer 664 may be patterned to expose the via structures 610, 612, 632. The isolation layer 664 may include a suitable dielectric. A metal layer such as an aluminum layer may be deposited on isolation layer 664 to form bottom surface redistribution lines (RDLs) 666. The metal layer may also form the bonding pads 668a and/or top electrode 608. The RDLs 666, the bonding pads 668a and/or the top electrode 608 may be formed at the same line. A metal line such as an aluminum layer may be deposited on isolation layer 664 and patterned to form RDLs 666, the bonding pads 668a and/or the top electrode 608.

Figure 6E:
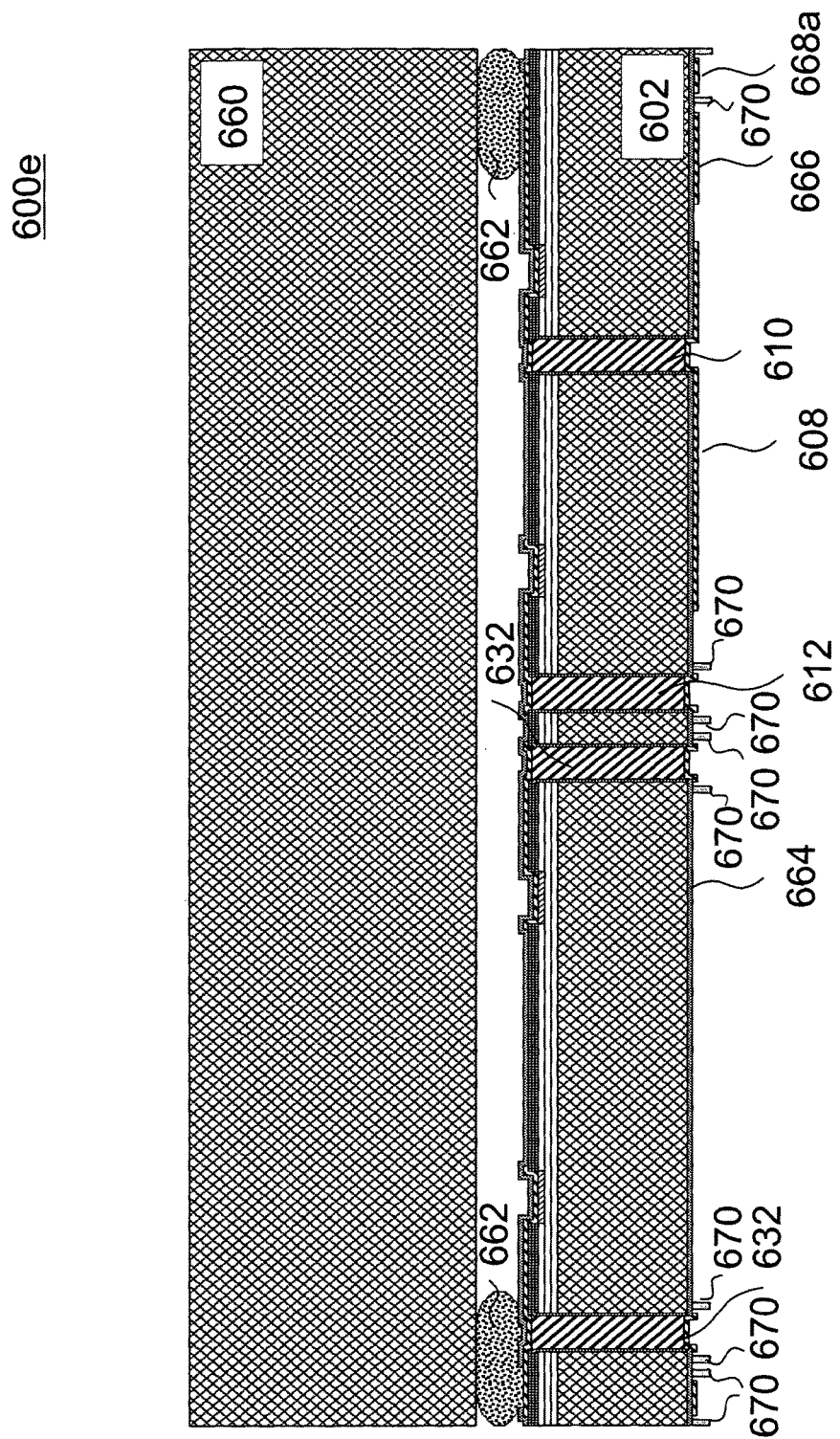
FIG. 6E is a schematic illustrating a method of forming gap control structures according to various embodiments.
Figure 6F:
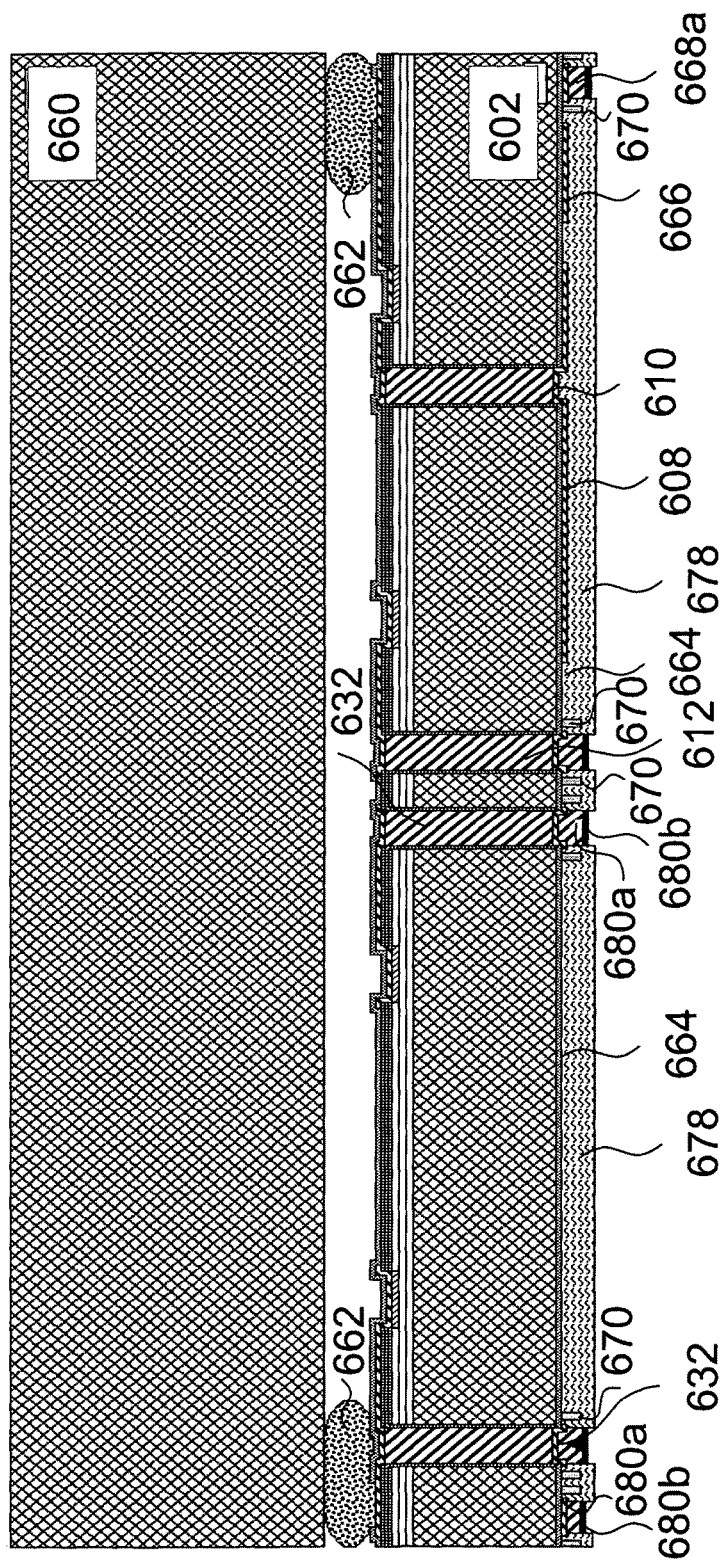
FIG. 6F is a schematic illustrating a method of depositing bonding materials according to various embodiments.

FIG. 6E is a schematic 600e illustrating a method of forming gap control structures 670 according to various embodiments. FIG. 6F is a schematic illustrating a method of depositing bonding materials 680a, 680b according to various embodiments. The method may further include forming gap control structures 670 on the isolation layers 664. Each gap control structure 670 may be formed around or in the vicinity of bonding pads 668a and/or via structures 610, 612, 632. In various embodiments, the method may also include bonding the first wafer 602 and a second wafer using molten state bonding. The gap control structures 670 may be configured for molten state bonding, using materials such as copper/tin or gold/tin, between the first wafer 602 and the second wafer. The gap control structures 670 may be configured to keep the molten bonding materials on the bonding pads 668a and/or via structures 610, 612, 632 and may be configured to prevent the molten materials from spreading outside the bonding pads 668a and/or via structures 610, 612, 632 during bonding. The molten bonding material may be deposited on bonding pads 668a and/or via structures 610, 612, 632. As the molten bonding material is kept from spreading, the gap between the first wafer 602 and the second wafer may be controlled. In various embodiments, the gap control structures 670 may be configured to precisely control the gap between the first wafer 602 and the second wafer. The gap control structures 670 may include a suitable dielectric material.

The method may further include depositing a photoresist layer and patterning the photoresist layer to form photoresist structures 678, e.g. by using mask such as a dark field (clear features) mask. In various embodiments, a first material 680a may be deposited on bond pad 668a (and/or via structures 610, 612, 632) and a second material 680b may be deposited on the first material 680b. For instance, gold may be deposited on bond pad 668a (and/or via structures 610, 612, 632) and tin may be deposited on gold. In various alternate embodiments, a first material may be deposited on bond pad 668a (and/or via structures 610, 612, 632) and a second material may be deposited on a second wafer. For instance if gold is deposited on bonding pads 668a (and/or via structures 610, 612, 632), tin may be deposited on the second wafer, and the first wafer 602 may be bonded to the second wafer using gold/tin bonding. The first material and the second material may form a eutectic system. The bonding may be eutectic bonding.

Figure 6G:
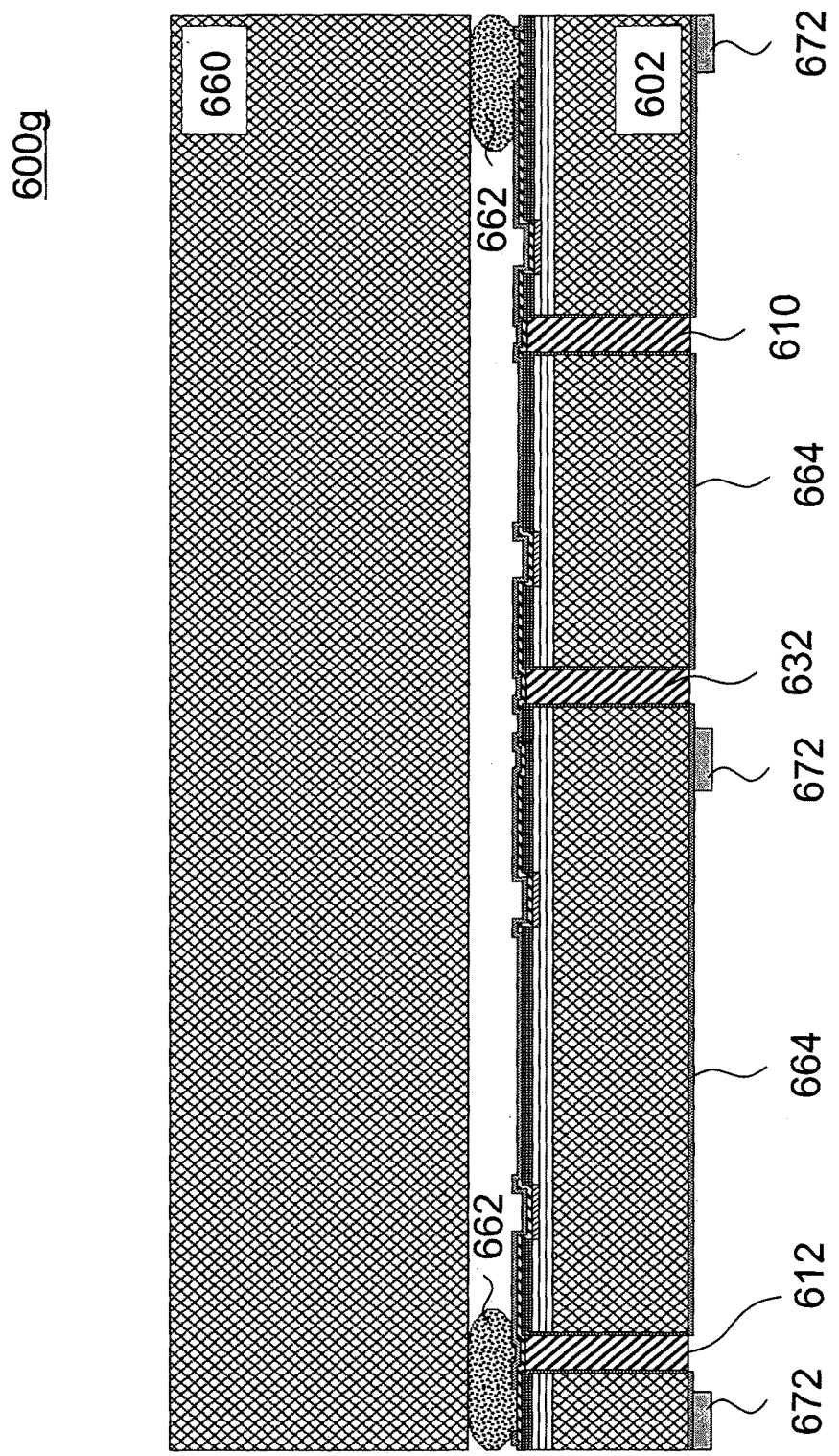
FIG. 6G is a schematic illustrating a method of forming standoff structures according to various embodiments.
Figure 6H:
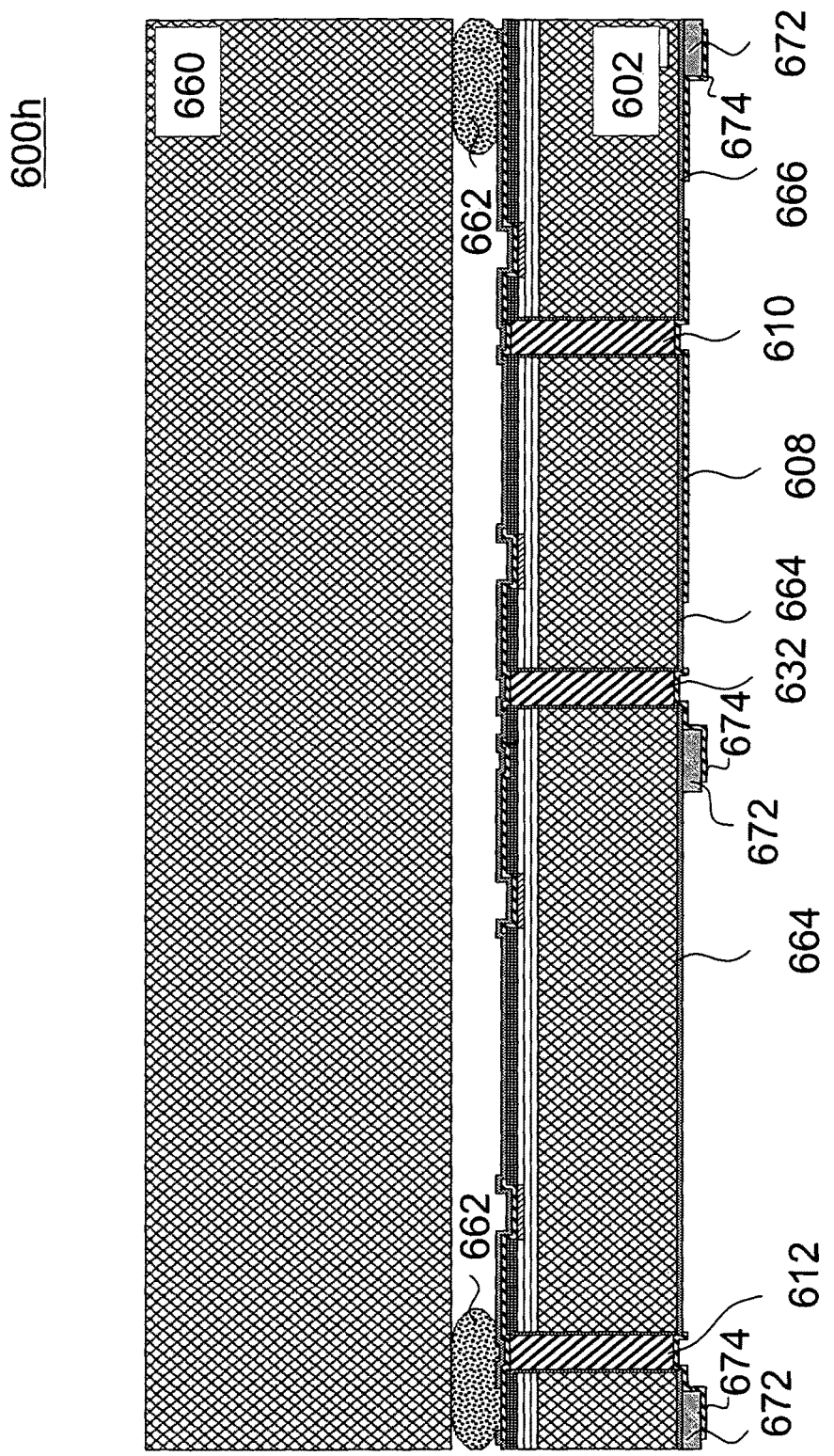
FIG. 6H is a schematic illustrating a method of forming a layered structure including bonding material at least partially on standoff structures according to various embodiments.

FIG. 6G is a schematic 600g illustrating a method of forming standoff structures 672 according to various embodiments. FIG. 6H is a schematic 600h illustrating a method of forming a layered structure 674 including bonding material at least partially on standoff structures 672 according to various embodiments. The layered structure 674 may include one or more layers of bonding material. The layered structure 674 may be or may include a stack structure. The layered structure 674 may be electrically connected to any one of the via structures 610, 612, 632. The layer structure may at least partially cover a lateral side of standoff structure 672. The layer structure may also at least partially cover bottom side of standoff structure 672. The bottom side may be substantially perpendicular to the lateral side. In various alternate embodiments, the method may include forming standoff structures 672 on isolation layers 664. In various alternate embodiments, the method may include bonding the first wafer 602 and a second wafer using solid state bonding. The bonding material may be or may include solid state bonding material. The standoff structures 672 may be configured for solid state bonding between the first wafer 602 and the second wafer. Solid state bonding may not require gap control structures 670. The bonding material used in solid state bonding may maintain their solid form and may not melt into each other during bonding during the bonding process. In other words, the bonding material used in solid state bonding may be configured to be solid during the high pressure and high temperature bonding process. In addition, the standoff material may be configured to be or remain in the solid state during bonding at the bonding pressure and temperature. The gap separation between the first wafer 602 and the second wafer may be predetermined or may be adjusted by using or selecting a standoff structure 672 with a predetermined thickness and/or applying a predetermined thickness of bonding material.

Suitable bonding materials may include copper to copper, aluminum to germanium, silicon dioxide to silicon or silicon to silicon. In various embodiments, a first material may be deposited on standoff structure 672 and a second material may be deposited on the first material. For instance, the first material may include aluminum and the second material may include germanium. In other words, the layered structure 674 may include the first material and the second material on the first material. In various alternate embodiments, the first material may be deposited in standoff structure 672 and the second material may be deposited on the second wafer. For instance, aluminum may be deposited on standoff structure 672 and germanium may be deposited on the second wafer. The stacked structure may include 0.7 im of aluminum and 0.4 im of germanium.

Standoff materials, i.e. material used for standoff structures 672 may include a dielectric layer such as any one of silicon dioxide or silicon nitride. Bonding and standoff material may not be limited to these examples and may include any other suitable materials. Any material which is suitable for MEMS fabrication and which maintain a solid state and rigid form at the bonding temperature and pressure may be used as a standoff or bonding material. The method may further include forming surface redistribution lines (RDLs) 666 and/or top electrode 608 on the standoff structure 672 and/or isolation layers 664. The surface redistribution lines (RDLs) 666 and/or top electrode 608 may be formed together with layered structure 674. The surface redistribution lines (RDLs) 666 and/or top electrode 608 may be formed from one or more of the bonding materials. The layered structure 674, surface redistribution lines (RDLs) 666 and/or top electrode 608 may be formed by depositing one or more layers of bonding material, followed by patterning.

Figure 6I:
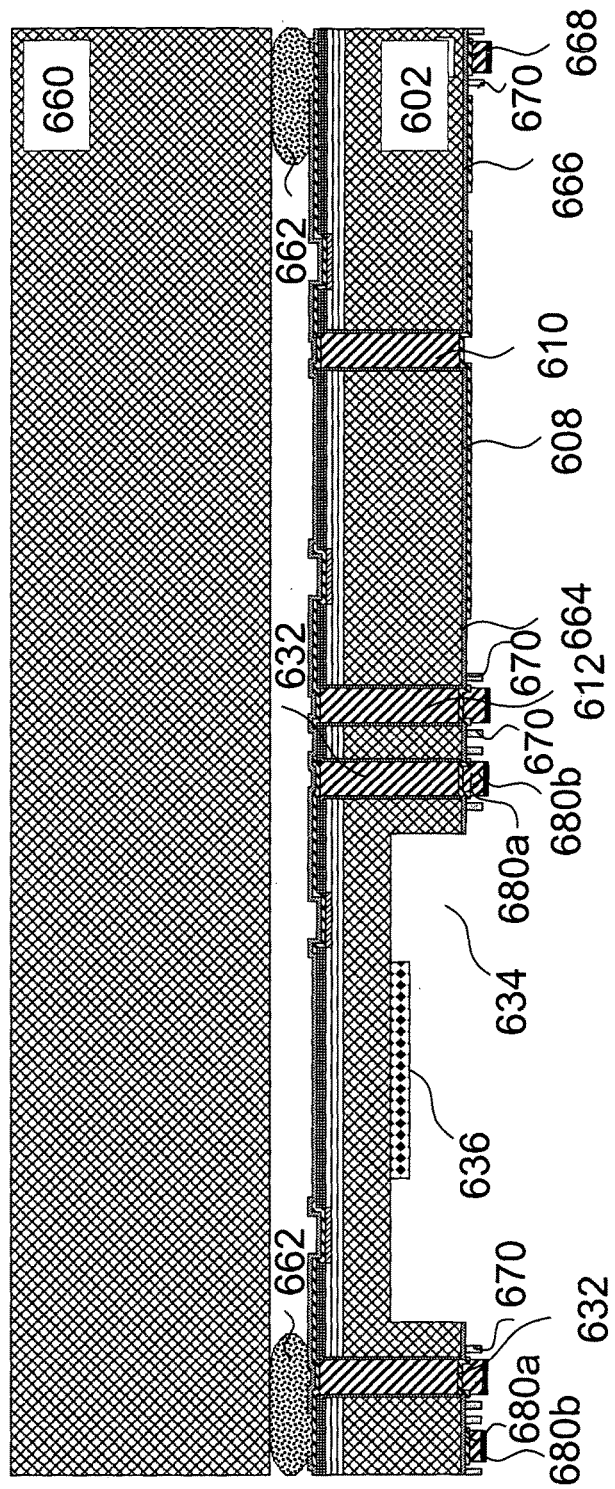
FIG. 6I is a schematic illustrating a method of depositing getter material in a cavity according to various embodiments.

FIG. 6I is a schematic 600i illustrating a method of depositing getter material 636 in a cavity 634 according to various embodiments. The method may include forming a cavity 634 on the second surface 604c of the first wafer 602. The method may further include depositing getter material 636 within the cavity 634. Getter material 636 may be required to help maintain the vacuum conditions of cavity 634. The method may include depositing a photoresist layer on the isolation layer 664. The method may further include patterning the photoresist layer. The patterned photoresist layer may be used to pattern the isolation layer 664. The patterned isolation layer may be used as a cavity etch mask to form cavity 634. The cavity 634 may be formed by removing a portion of the wafer 602 on a portion of the second surface 604c. The getter material 636 may be deposited on a surface of cavity 634. The surface of cavity 634 may be substantially parallel to the second surface 604c. The deposited getter material 636 may be patterned.

Figure 6J:
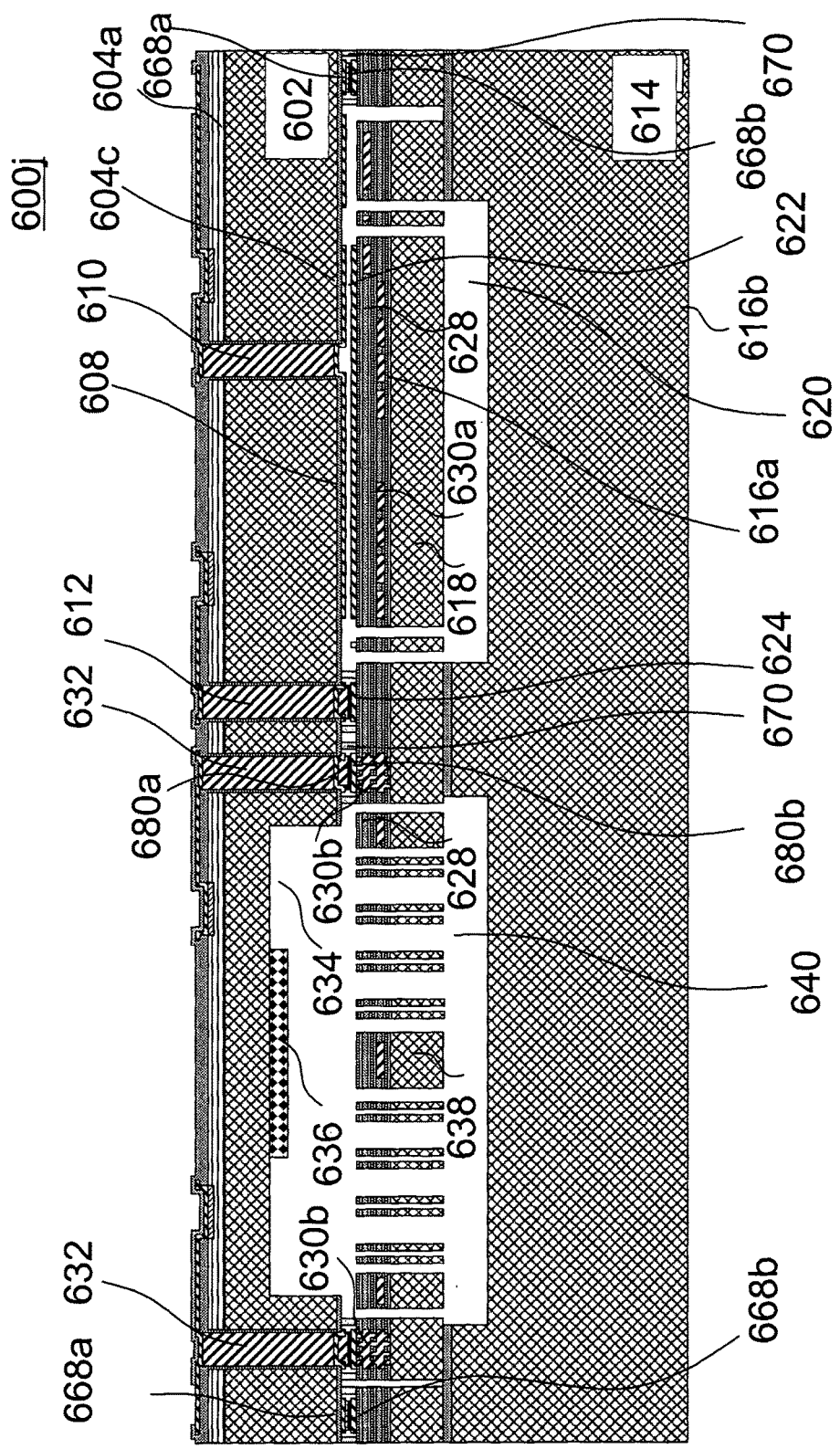
FIG. 6J is a schematic illustrating bonding the first wafer to a second wafer according to various embodiments.

FIG. 6J is a schematic 600j illustrating bonding the first wafer 602 to a second wafer 614 according to various embodiments. The second wafer 614 may or may not be the second wafer illustrated in FIGS. 3A, 4F, 5C. The first wafer 602 may or may not be the first wafer 602 illustrated in FIGS. 6F, 6I. The second wafer 614 may have a first surface 616a and a second surface 616b opposite the first surface 616a. The first surface 616a of the second wafer may include a suspended structure 618. The suspended structure 618 may have a spacing 620 between the suspended structure 618 and the second surface 616b. A plurality of dielectric layers 628 may be on the second wafer 614, such as on the suspended structure 618. A coil structure and/or metal layers may be present on or embedded within the plurality of dielectric layers 628 on the suspended structure 618. The plurality of dielectric layers 628 may include a coil structure 630a. Various embodiments may further include a coil structure 630a on the first surface 616a of the second wafer 614. The coil structure 630a may be on the suspended structure 618. The coil structure 630a may be part of a magnetometer. The coil structure 630a may alternatively or additionally be on other portions of the first surface 616a. The coil structure 630a may be embedded in the plurality of dielectric layers 628. The coil structure 630a may include a plurality of concentric rings. The coil structure 630a may be a single metal layer of concentric rings between a first dielectric layer and a second dielectric layer of the plurality of dielectric layers 628. Alternatively, the coil structure 630a may include a plurality of metal layers. Each metal layer of the plurality of metal layers may be separated by a dielectric layer. The coil structure 630a may be under the second electrode 622. The coil structure may extend through the plurality of dielectric layers 628.

A multi-layer metal structure 630b may be present on the plurality of dielectric layers 628. The multilayer structure 630b may include a first layer; a conductive via on the first metal layer and a second metal layer on the conductive via. The multilayer structure 630b may further include a further conductive via on the second metal layer and a third metal layer on the further conductive via. The multilayer structure 630b may extend through the plurality of dielectric layers 628. The multilayer structure 630b may be configured to electrically connect electrical structures on the plurality of dielectric layers 628 to electrical structures on the first surface 616a. The multilayer structure 630b may be configured to electrically connect electrical structures on first surface 616a of second wafer 614 to electrical structures on second surface 604b of first wafer 602, such as through via structures 632, when the first wafer 602 is bonded to the second wafer 614. The coupling of multilayer structures 630b with through via structures 632 also allows for electrical connection between first surface 604a of first wafer 602 and second surface 616a of second wafer 614.

A bottom electrode 622 may be on the plurality of dielectric layers 628 on the suspended structure 618. The second wafer 614 may further include an interconnection structure 624. The interconnection structure 624 may electrically connect the bottom electrode 608.

The second wafer 614 may also include a further suspended structure 638 on the first surface 616a of the second wafer 614. The suspended structure 618 and the further suspended structure may be on different portions of the second wafer 614. The further suspended structure 638 may have a spacing 640 between the further suspended structure 638 and the second surface 616b.

The transfer wafer 660 may be removed from the first wafer 602 after the first wafer 602 is bonded to the second wafer 614. The first wafer 602 may be bonded to the second wafer 614 with the second surface 604b of the first wafer 602 facing the first surface 616a of the second wafer 614. The via structure 612 may electrically connect the interconnect structure 624. The via structure 610 may electrically connect the top electrode 608. The top electrode 608 and the bottom electrode 622 may form a capacitive structure. The via structures 632 may electrically connect the multilayer metal structure 630b.

Bonding may include molten state material bonding. Bonding may be eutectic bonding. For instance copper and tin may be used for bonding. The first wafer 602 and the second wafer 614 may be brought together by overlapping the copper/tin regions of both wafers 602, 614. The tin material around the bonded regions may be squeezed, melted to form eutectic bonds between the two wafers 602, 614. The copper/tin may be predeposited on the first wafer 602 or on the second wafer. Alternatively, a first material may be predeposited on the first wafer 602 and a second material may be predeposited on the second wafer 614.

Bond pads 668a on the first wafer 602 may be bonded to bond pads 668b on the second wafer 614 with the bonding material. The bonding materials may include a first material and a second material. The first and second materials may be deposited on bond pads 668a or on bond pads 668b. The first and second materials may form a stacked structure on bond pads 668a or on bond pads 668b. Alternatively, the first material may be deposited on bond pads 668a and the second material may be deposited on bond pads 668b.

Gap control structures 670 may be used to control the distance or gap between the first wafer 602 and the second wafer 614. In other words, the electromechanical device may include one or more gap control structures 670 between the first wafer 602 and the second wafer 614. The gap control structures may be configured to keep the bonding materials within the gap control structures 670.

Figure 6K:
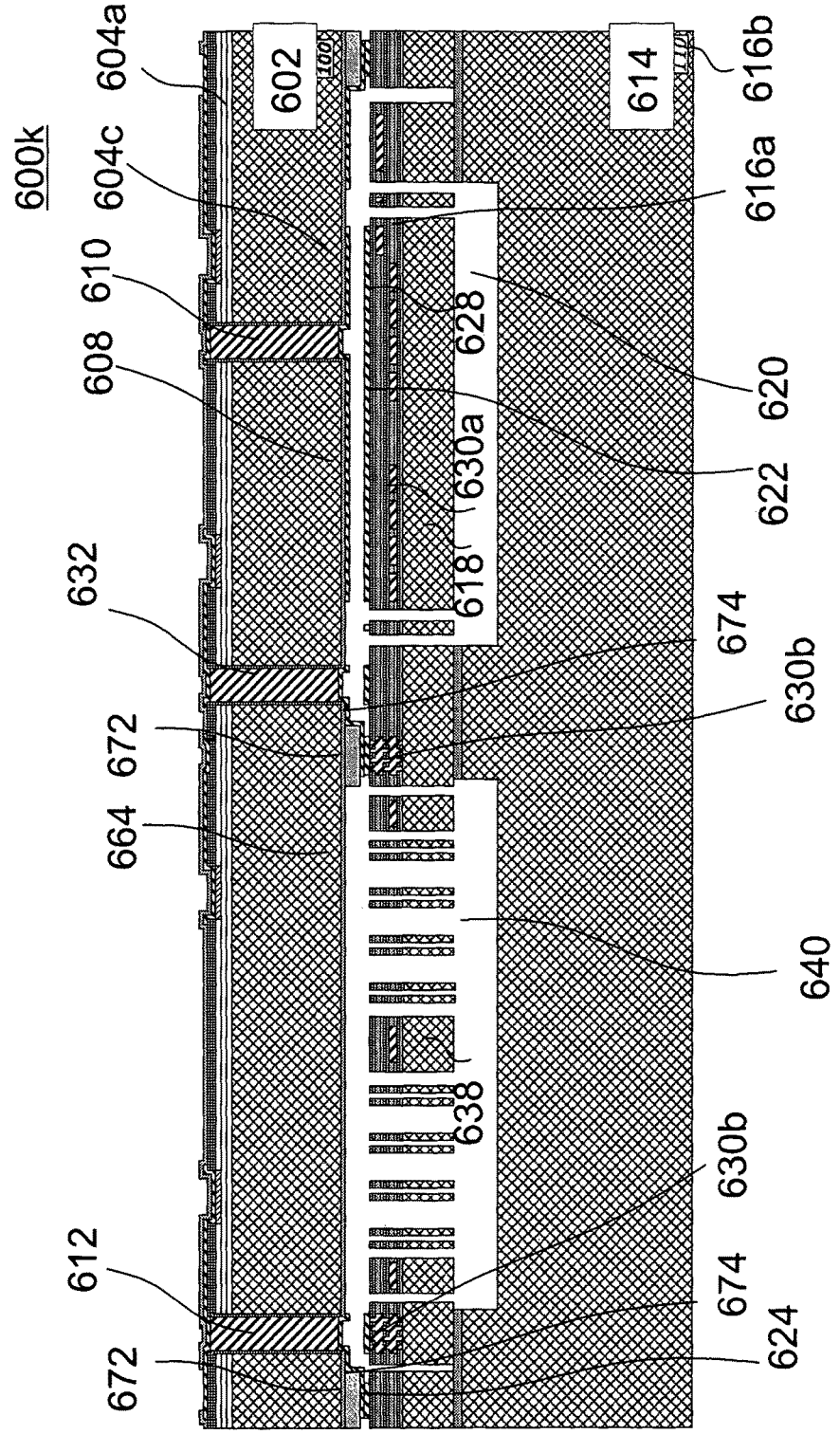
FIG. 6K is a schematic illustrating bonding the first wafer to a second wafer according to various embodiments.

FIG. 6K is a schematic 600k illustrating bonding the first wafer 602 to a second wafer 614 according to various embodiments. The second wafer 614 may or may not be the second wafer illustrated in FIGS. 3A, 4F, 5C. The first wafer 602 may or may not be the first wafer 602 illustrated in FIG. 6H. Bonding may include solid state bonding. In various embodiments, the method may include forming standoff structures 672 on the first wafer 602, e.g. on isolation layers 664. The method may further include forming layered structures 674 at least partially on standoff structures 672. The layered structures 674 may be electrically connected to via structures 610, 612, 632. In various embodiments, the layered structures 674 may include a first material and a second material. The layered structures 674 may be pre-formed on the first wafer 602. In various embodiments, the layered structures may at least partially be formed on second wafer 604. In various embodiments, a first structure including a first material may be pre-formed on the first wafer 602 and a second structure including a second material may be pre-formed on the second wafer 614. Various embodiments using solid state bonding may be able to control the gap between the first wafer 602 and the second wafer 614 more precisely compared to molten state material bonding.

The via structure 632 may be electrically connected to multilayer metal structure 630b. The via structure 632 may be electrically connected to multilayer metal structure 630b via layered structures 674. The via structure 612 may be electrically connected to interconnect structure 624. The via structure 612 may be electrically connected to interconnect structure 624 via layered structures 674. The top electrode 608 and the bottom electrode 622 may form a capacitive structure. For solid state bonding, the top surface of the layered structures 674 may be sufficient for bonding and additional bonding pads may not be required.

Figure 7A:
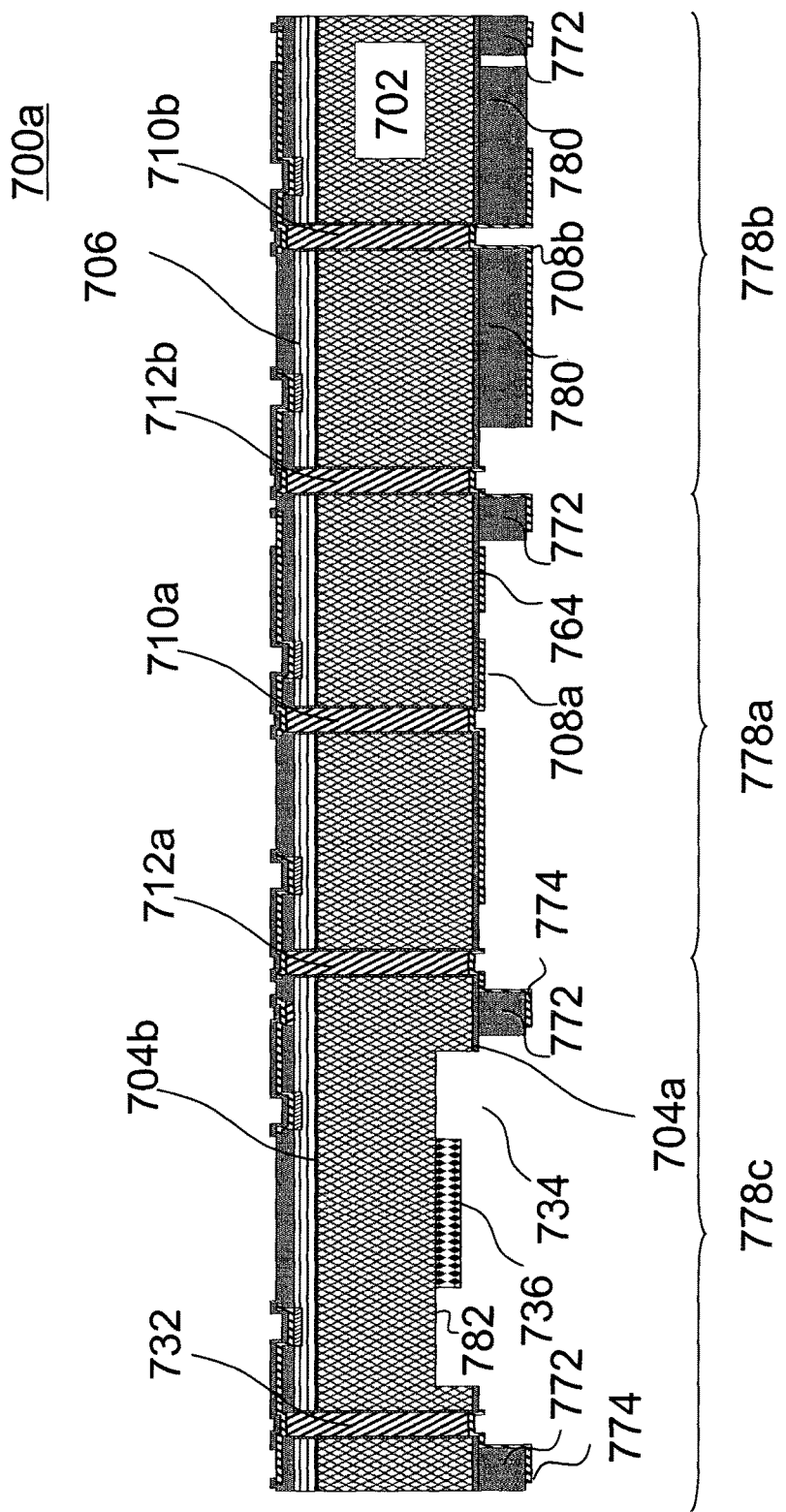
FIG. 7A is a schematic illustrating forming of a compensation structure on the first wafer according to various embodiments.
Figure 7B:
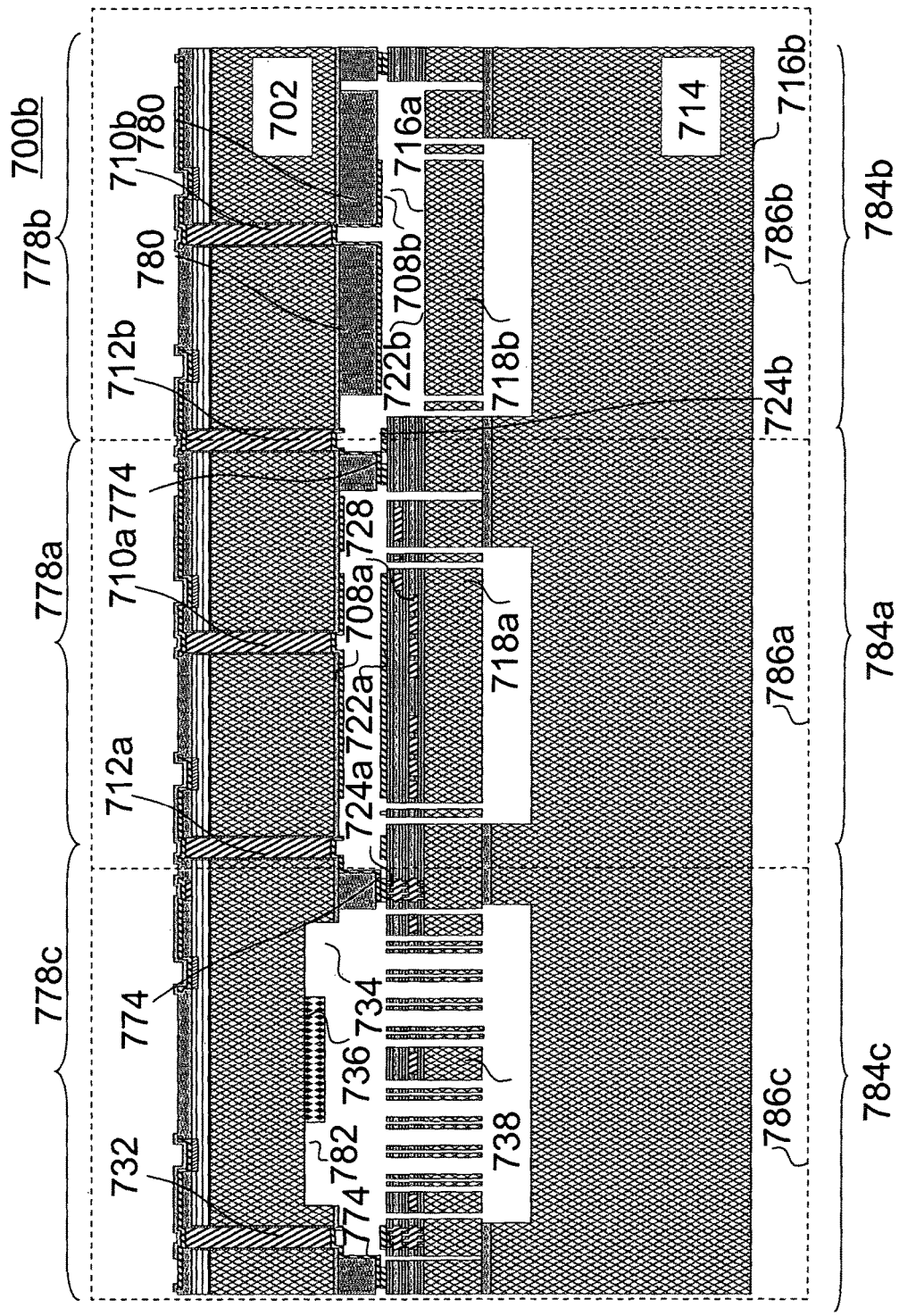
FIG. 7B is a schematic illustrating bonding the first wafer to a second wafer according to various embodiments.

FIGS. 7A-B illustrate a method to form magnetometer structures together with accelerometer and/or gyroscopes according to various embodiments. As illustrated in FIGS. 5A-C, the method may include removing the portion of dielectric layers deposited on the portion second wafer for forming the gyroscopes and/or accelerometers. However, the removal of the portion of dielectric layer may result in an increased gap between the top electrode (on the first wafer) and the bottom electrode (on the second wafer). The increase in gap may result in a decreased sensitivity of vertically movable sensors, e.g. vertical movable accelerometer and vertically movable gyroscopes. Further more, the removal of the portion of dielectric layers may result on a lack of surface to form the bottom electrode.

FIG. 7A is a schematic 700a illustrating forming of a compensation structure on the first wafer 702 according to various embodiments. The method may include providing a first wafer 702 with a surface 704a having a first portion 778a and a second portion 778b. The first wafer 702 may have a further surface 704b opposite the surface 704a. The method may further include forming a compensation structure 780 on or over the second portion 778b of the surface 704a of the first wafer 702. A top electrode 708a may be formed on or over the first portion 778a of surface 704a. A further top electrode 708b may be formed on or over the compensation structure 780.

The surface 704a may further have a third portion 778c. A cavity 734 may be formed on the third portion. Getter material 736 may be deposited within cavity 734. The cavity 734 may have an inner surface 782. Surface 782 may be substantially parallel to second surface 704b of wafer. The getter material may be deposited on surface 782.

An isolation layer 764 may be deposited on second surface 704b. The isolation layer 764 may include a first portion on the first portion 778a of first wafer 702 and a second portion on the second portion 778b of first wafer 702. The isolation layer 764 may further include a third portion on the third portion 778c of first wafer 702. Forming compensation structure 780 on the second portion 778b of the surface 704a may include forming the compensation structure 780 on the second portion of isolation layer 764. Top electrode 708a may be formed on the first portion of isolation layer 764. The method may further include forming via structures 710a, 710b, 712a, 712b, 732 on the first wafer 702a. The via structures 710a, 710b, 712a, 712b, 732 may be through via structures. Top electrode 708a may be electrically connected to via structure 710a. Top electrode 708b may be electrically connected to via structure 710b. The top electrode 710b may cover a lateral side of compensation structure 780.

The method may further include forming a circuit arrangement 706 on the further surface 704b. The circuit arrangement 706 may be electrically connected to via structures 710a, 710b, 712a, 712b, 732. The circuit arrangement 706 may include a circuit or may include a plurality of discrete circuits. The circuit arrangement 706 may additionally or alternatively include metal pads, electrical pads and/or redistribution lines.

The method may also include forming standoff structures 772. The standoff structures may be formed on isolation layer 764. The method may further include forming layered structure 774 at least partially on standoff structures 772. The layered structure 774 may include one or more bonding material. The layered structured 774 may include a stack of a first material and a second material on the first material. The layered structure may be formed on a lateral side of standoff structures 772.

The layered structures 772 may be electrically connected to via structures 712a, 712b, 732. The standoff structures 772 and the compensation structures 780 may be formed of the same material or may be formed of different materials. The standoff structures 772 and the compensation structures 780 may include a suitable dielectric material. The layered structures 774 and the electrodes 708a, 708b may be formed from the same material or from different materials.

Various embodiments allow cavity 734, top electrodes 708a, 708b to be fabricated side by side at different height levels. The different height levels may be created by etching a cavity 734 on the surface 706a for deposition of getter material 736 and forming a compensation structure 780 on which top electrode 708b may be formed.

FIG. 7B is a schematic 700b illustrating bonding the first wafer 702 to a second wafer 714 according to various embodiments. The second wafer 704 may have a surface 716a and a further surface 716b opposite the surface 716a. The surface 716a may include a first portion 784a and a second portion 784b. The method may also include depositing a plurality of dielectric layers 728 on the surface 716a of the second wafer 714. The method may further include forming a coil structure on a first portion of the plurality of the dielectric layers 728. The first portion of the plurality of the dielectric layers 728 may be on the first portion 784a of the surface 716a of the second wafer 714. The coil structure may extend through the first portion of the plurality of dielectric layers 728. The method may further include removing a second portion of the plurality of dielectric layers 728 on the second portion 784b of the surface 716b of the second wafer 714. In other words, the second portion 784b may be devoid of any dielectric layer 728.

The method may also include forming a first electromechanical structure 718a, such as a first suspended structure, on the first portion 784a of the surface 716a of the second wafer 714. The method may additionally include forming a second electromechanical structure 784b, such as second suspended structure, on a second portion 784b of the surface 716a of the second wafer 714. A first bottom electrode 722a may be formed on the portion of dielectric layer 728 on first portion 784a. The second portion 784b may be a second bottom electrode 722b. In other words, the second wafer 714 itself may be used as the second bottom electrode 722b without the need of a metal layer as bottom electrode. The first wafer 702 and/or second wafer 714 may include a suitable semiconductor material such as silicon.

The method may further include bonding the first wafer 702 to the second wafer 714 with the surface 704a of the first wafer 702 facing the surface 716a of the second wafer 714. The first bottom electrode 722a may be electrically connected to via structure 712a, for instance, via a layered structure 774 and an interconnect structure 724a. The second bottom electrode 722b may be electrically connected to via structure 712b, for instance via an interconnect structure 724b. The interconnect structures 724a, 724b may be formed on or over the surface 716a of second wafer 714, e.g. on the plurality of dielectric layers 728.

The first portion 778a of the first wafer 702 may face the first electromechanical structure 718a. The top electrode 708a and the bottom electrode 722a may form or may be separated by a first predetermined gap. The compensation structure 780 may face the second electromechanical structure 718b. The top electrode 708b and the bottom electrode 722b may form or may be separated by a second predetermined gap.

A first electromechanical component 786a, such as a magnetometer, may be formed by the bonding of the first wafer 702 and the second wafer 714. A second electromechanical component 786b, such as a vertically movable gyroscope or a vertically movable accelerometer, may be formed by the bonding of the first wafer 702 and the second wafer 714.

The surface 706a may include a third portion 784c. The plurality of dielectric layers 728 may also be deposited on the third portion 784c. The method may also include forming a third electromechanical structure 738, such as a suspended structure, on the portion 784c of the surface 716a of the second wafer 714. There may be a third predetermined gap between the surface 782 and the portion of dielectric layers 728 deposited on third portion 784c. A third electromechanical component 786c, such as a laterally movable magnetometer, a laterally movable gyroscope or a laterally movable accelerometer, may be formed by the bonding of the first wafer 702 and the second wafer 714.

Various embodiments may reduce stress of electromechanical structures 718b of electromechanical components 786b such as gyroscopes and accelerometers by removing the dielectric layers 728 on the electromechanical structure 718b. The increased in gap between the top electrode 708a (on the first wafer 702) and the bottom electrode 722b (on the second wafer 714) may be compensated or reduced by compensation structures 780. Further more, the bottom electrode 722b may be formed by the wafer 714 itself.

Further, cavities 734 may be etched to form a third surface 782. In other words, inner surface 782, compensation structure 780 and surface 704a may form three surface levels on first wafer 702.

Various embodiments allow the fabrication of magnetometers along gyroscopes and/or magnetometers. Various embodiments allow the fabrication of vertically movable magnetometers along gyroscopes and/or magnetometers.

Various embodiments provide a three dimensional, capacitive inertial MEMS platform or device. The MEMS platform or device allows the fabrication of three-axis accelerometers, three-axis gyroscopes and three-axis magnetometers in a very compact and cheap way. Various embodiments allow the integration of fabrication of magnetometers to the fabrication of accelerometers and/or gyroscopes. Various embodiments address the performance problem of conventional magnetometer structures by including a coil structure to improve performance. Various embodiments provide multilayer metallization to form the coil structure on suspended magnetometer structures.

Figure 8A:
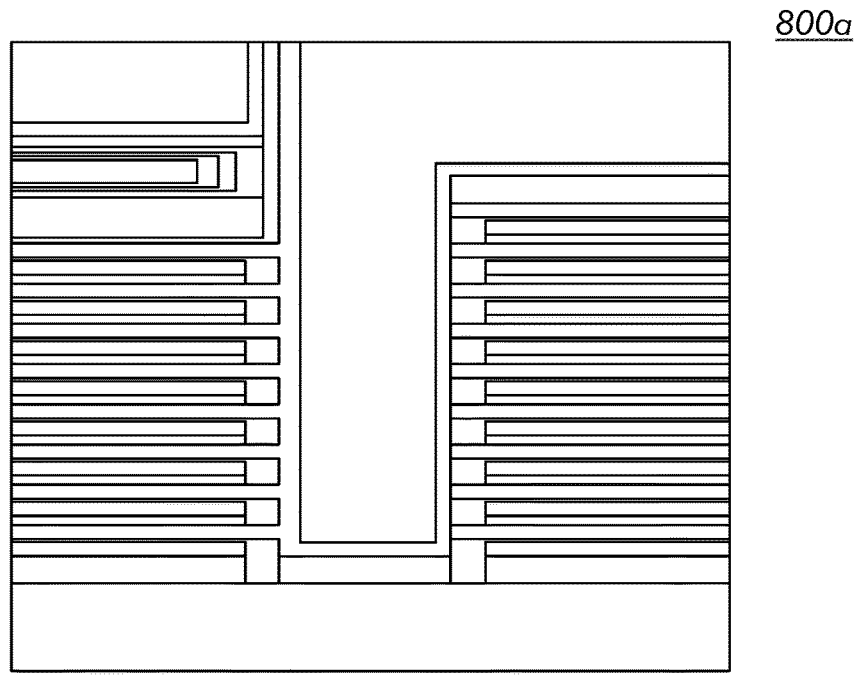
FIG. 8A is an image of an electromechanical structure formed.
Figure 8B:
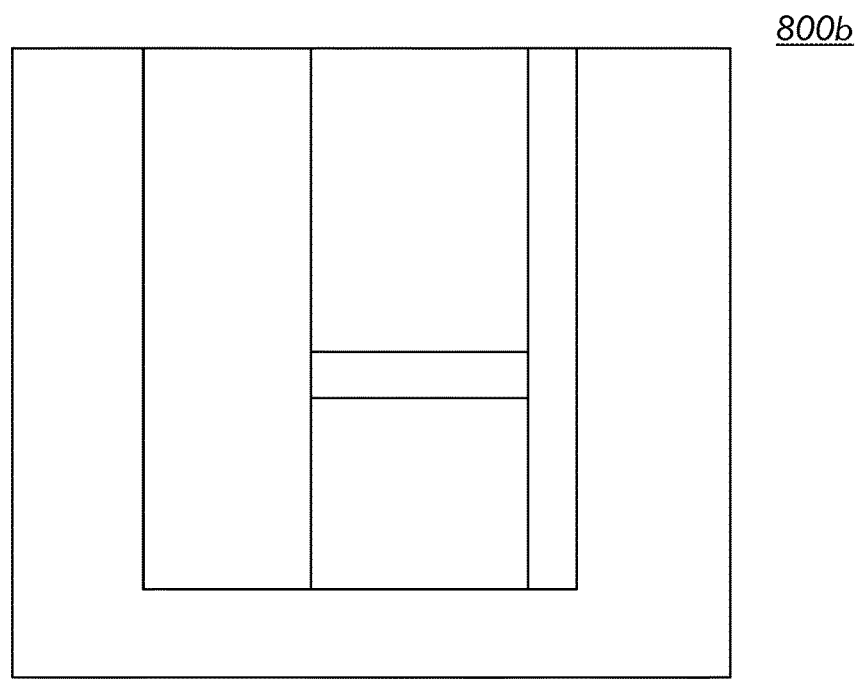
FIG. 8B is a zoomed-in image of a part of the electromechanical structure shown in FIG. 8A.
Figure 8C:
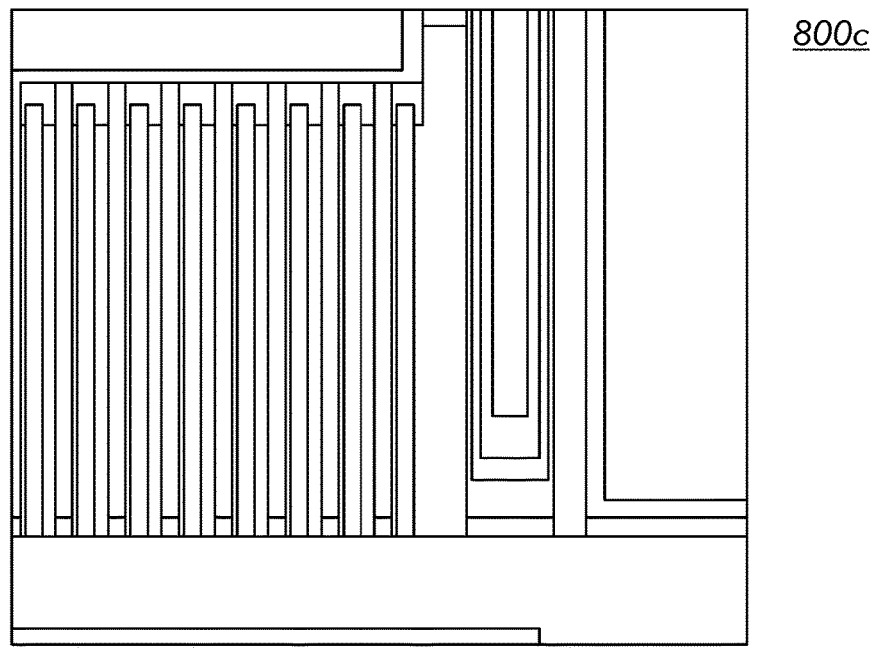
FIG. 8C is an image of another electromechanical structure formed.
Figure 8D:
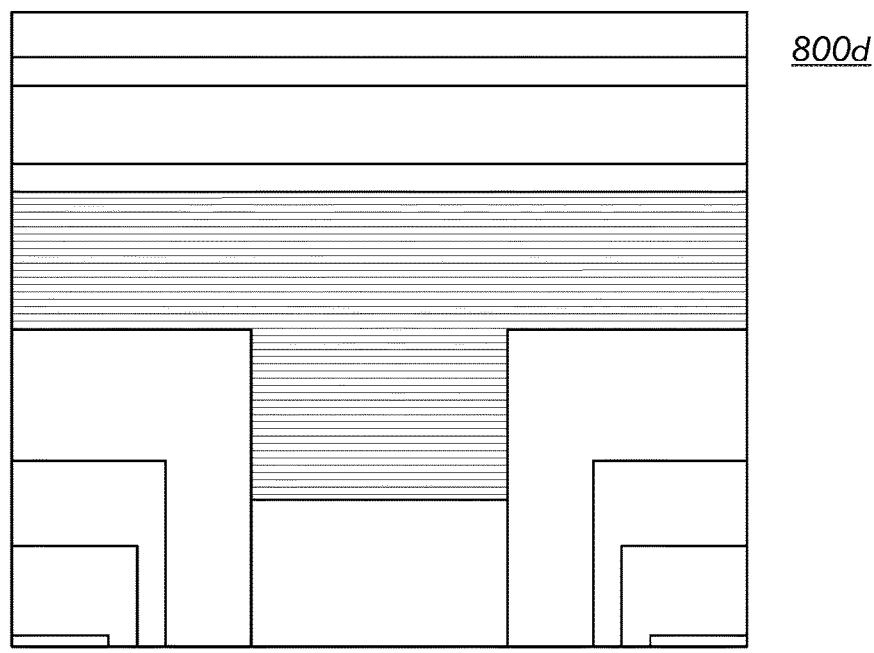
FIG. 8D is a zoomed-in image of a part of the electromechanical structure shown in FIG. 8C.

Embodiments of electromechanical devices haven been fabricated. In the first integration lot, 20 ìm thick suspended micro-electromechanical structures (MEMS) with 1.9 ìm insulating layers and 3 metal-3 vias multilayer structures have been fabricated successfully. FIG. 8A-D are scanning electron microscopy (SEM) images of fabricated electromechanical devices. FIG. 8A is an image 800a of an electromechanical structure formed. FIG. 8B is a zoomed-in image 800b of a part of the electromechanical structure shown in FIG. 8A. FIG. 8C is an image 800c of another electromechanical structure formed. FIG. 8D is a zoomed-in image 800d of a part of the electromechanical structure shown in FIG. 8C.

The first integration results reveal that the structures have been successfully suspended with the final deep reactive ion etching (step). None of the electromechanical structures have experienced any stiction problems after release. This is an expected result of using cavity wafers, which require only drying etching steps during fabrication. Finger spacings measured are about 1 ìm, which is about the same as the design value.

Figure 9A:
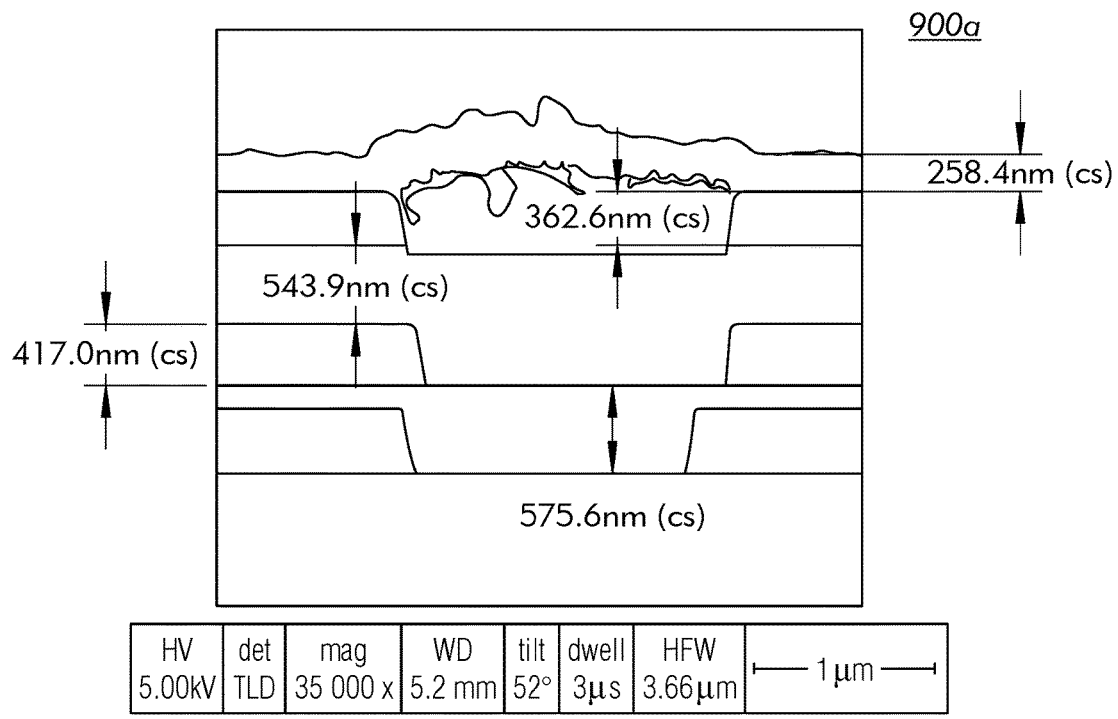
FIG. 9A is a cross-sectional image of a contact region.
Figure 9B:
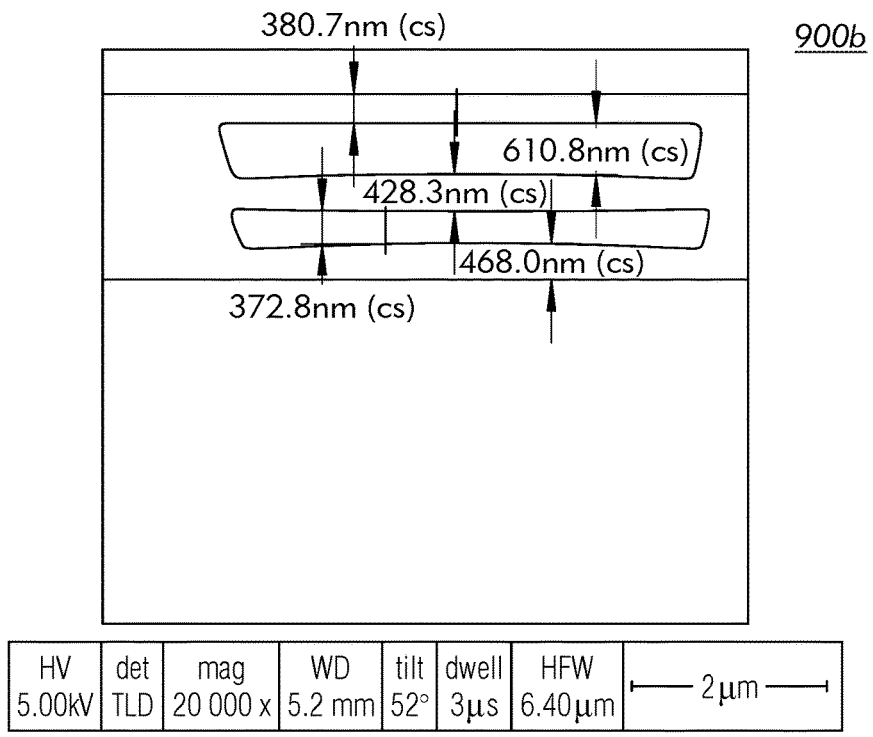
FIG. 9B is a cross-sectional image of metal lines embedded in a plurality of dielectric layers.

FIG. 9A-B are cross-sectional scanning electron microscopy (SEM) images of contact and metal regions of fabricated electromechanical devices. FIG. 9A is a cross-sectional image 900a of a contact region. FIG. 9B is a cross-sectional image 900b of metal lines embedded in a plurality of dielectric layers. Resistances of currents paths for comb finger type magnetometer devices are also measured. The measured values are very close to the designed resistance values. Resistances of current paths are important for determining the overall power consumption of the electromechanical device. Matching of the measured and simulation results also show that the fabrication of the multi-layer metal structure, i.e. metal 1-via 2-metal 2-via 3-metal 3 stack, are successful and connection between the metal layers are good. MEMS wafers fabricated in a second lot will be bonded to CMOS wafer to complete the integration process.

Figures serve only to illustrate certain features according to various embodiments and are not intended to limit the subject matter. The figures may or may not follow sequentially from one another. Further, features may not be labeled in all the figures to reduce clutter and to improve the clarity the figures.

Methods described herein may further contain analogous features of any device or structures described herein. Correspondingly, devices or structures described herein may further contain analogous features of any methods described herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method of fabricating an electromechanical device, the method comprising:
providing a first wafer;
forming a circuit arrangement on a first surface of the first wafer;
forming a first electrode on a second surface of the first wafer;
forming a first via structure from the first surface of the first wafer to the second surface of the first wafer, the first via structure electrically connecting the first electrode with the circuit arrangement;
forming a second via structure from the first surface of the first wafer to the second surface of the first wafer, the second via structure electrically connecting the circuit arrangement;
providing a second wafer;
forming a suspended structure on a first surface of the second wafer with a spacing formed between the suspended structure and a second surface of the second wafer;
forming a second electrode on the suspended structure;
forming an interconnect structure on the first surface of the second wafer, the interconnect structure electrically connecting the second electrode; and
bonding the first wafer to the second wafer with the second surface of the first wafer facing the first surface of the second wafer, the second via structure electrically connecting the interconnect structure, and the first electrode and the second electrode forming a capacitive structure.

2. The method according to claim 1, further comprising:
forming a sealing structure between the first wafer and the second wafer.

3. The method according to claim 1, further comprising:
forming a coil structure on the first surface of the second wafer.

4. The method according to claim 3, wherein forming the coil structure comprises:
forming a first metal layer; and
forming a conductive via on the first metal layer and forming a second metal layer on the conductive via.

5. The method according to claim 3, further comprising:
attaching the first wafer to a transfer wafer with the first surface of the first wafer facing the transfer wafer; and
removing a portion of the first wafer to form the second surface of the first wafer.

6. The method according to claim 1, further comprising:
forming a third via structure from the first surface of the first wafer to the second surface of the first wafer;
forming a multi-layer metal structure on the first surface of the second wafer; and
bonding the first wafer to the second wafer with the third via structure electrically connecting the multilayer metal structure.

7. The method according to claim 1,
wherein the suspended structure, the first electrode on the second surface of the first wafer and the second electrode on the suspended structure form any one of a lateral axis magnetometer, a differential vertical axis accelerometer, a single ended vertical axis accelerometer and a see-saw resonator.

8. The method according to claim 1, further comprising:
forming a cavity on the second surface of the first wafer; and
depositing getter material within the cavity.

9. The method according to claim 8, further comprising:
bonding the first wafer to the second wafer to vacuum-seal the cavity.

10. The method according to claim 9, further comprising:
forming a further suspended structure on the first surface of the second wafer with a further spacing formed between the further suspended structure and the second surface of the second wafer.

11. An electromechanical device comprising:
a first wafer having a first surface and a second surface opposite the first surface;
a circuit arrangement on the first surface of the first wafer;
a first electrode on the second surface of the first wafer;
a first via structure extending from the first surface of the first wafer to the second surface of the first wafer, the first via structure electrically connecting the first electrode with the circuit arrangement;
a second via structure extending from the first surface of the first wafer to the second surface of the first wafer, the second via structure electrically connecting with the circuit arrangement;
a second wafer bonded to the first wafer, the second wafer having a first surface and a second surface opposite the first surface;
a suspended structure on the first surface of the second wafer with a spacing between the suspended structure and the second surface of the second wafer;
a second electrode on the suspended structure; and
an interconnect structure on the first surface of the second wafer, the interconnect structure electrically connecting the second electrode;
wherein the first wafer is bonded to the second wafer with the second surface of the first wafer facing the first surface of the second wafer, the second via structure electrically connecting the interconnect structure and the first electrode and the second electrode forming a capacitive structure.

12. The electromechanical device according to claim 11, further comprising:
a sealing structure between the first wafer and the second wafer.

13. The electromechanical device according to claim 11, further comprising:
a coil structure on the first surface of the second wafer.

14. The electromechanical device according to claim 13, wherein the coil structure comprises:
a first metal layer; and a conductive via on the first metal layer and a second metal layer on the conductive via.

15. The electromechanical device according to claim 11, further comprising:
a third via structure extending from the first surface of the first wafer to the second surface of the first wafer;
a multi-layer metal structure on the first surface of the second wafer; and
wherein the first wafer is bonded to the second wafer with the third via structure electrically connecting the multi-layer metal structure.

16. The electromechanical device according to claim 11, wherein the suspended structure, the first electrode on the second surface of the first wafer and the second electrode on the suspended structure form any one of a lateral axis magnetometer, a differential vertical axis accelerometer, a single ended vertical axis accelerometer and a see-saw resonator.

17. The electromechanical device according to claim 11, further comprising:
a cavity on the second surface of the first wafer; and getter material within the cavity.

18. The electromechanical device according to claim 17, wherein the cavity is a vacuum-sealed cavity.

19. The method according to claim 18, further comprising:
a further suspended structure on the first surface of the second wafer within the vacuum-sealed cavity with a further spacing formed between the further suspended structure and the second surface of the second wafer.

20. The electromechanical device according to claim 19, wherein the further suspended structure is any one of a vertical axis magnetometer, a lateral axis magnetometer, a differential vertical axis accelerometer, single ended vertical axis accelerometer, a lateral axis accelerometer, a fully differential lateral axis accelerometer, a vertical axis gyroscope, a lateral resonator and a see-saw resonator.

* * * * *